United States Patent [19]

Varshney et al.

[11] 4,165,541
[45] Aug. 21, 1979

[54] SERIAL-PARALLEL-SERIAL CHARGE-COUPLED DEVICE MEMORY HAVING INTERLACING AND RIPPLE CLOCKING OF THE PARALLEL SHIFT REGISTERS

[75] Inventors: Ramesh C. Varshney, Sunnyvale; Kalyanasundaram Venkateswaran, San Jose; Gilbert F. Amelio, Saratoga, all of Calif.

[73] Assignee: Fairchild Camera and Instrument Corporation, Mountain View, Calif.

[21] Appl. No.: 860,001

[22] Filed: Dec. 12, 1977

[51] Int. Cl.² ............... G11C 7/00; G11C 21/00
[52] U.S. Cl. ........................... 365/219; 365/77; 365/183
[58] Field of Search ............... 365/183, 77, 189, 219, 365/222

[56] References Cited

U.S. PATENT DOCUMENTS 3,946,368  3/1976  Chou ............................ 365/183

OTHER PUBLICATIONS

Mohsen et al., A16-K Bit Block Addressed Charge-Coupled Memory Device, IEEE Transactions on Electron Devices, vol. ED-23, No. 2, 2/76, pp. 108-116.
Rosenbaum et al., A16384-Bit High-Density CCD Memory, IEEE Transactions on Electron Devices, vol. ED-23, No. 2, 2/76, pp. 101-108.

Primary Examiner—Stuart N. Hecker
Attorney, Agent, or Firm—Alan H. MacPherson; Robert C. Colwell

[57] ABSTRACT

A serial-parallel-serial organized charge-coupled device memory incorporates interlacing and ripple clocking of the parallel shift registers to achieve a high density of bits per unit area. The memory is organized as sixteen 4,096-bit blocks which are randomly accessible. The data in each of the sixteen blocks advance simultaneously at the rate of one bit per cycle. Each block has its own reference charge generator, sense amplifier, input-output decoder and CCD input circuit.

13 Claims, 37 Drawing Figures

SYSTEM BLOCK DIAGRAM

SYSTEM BLOCK DIAGRAM

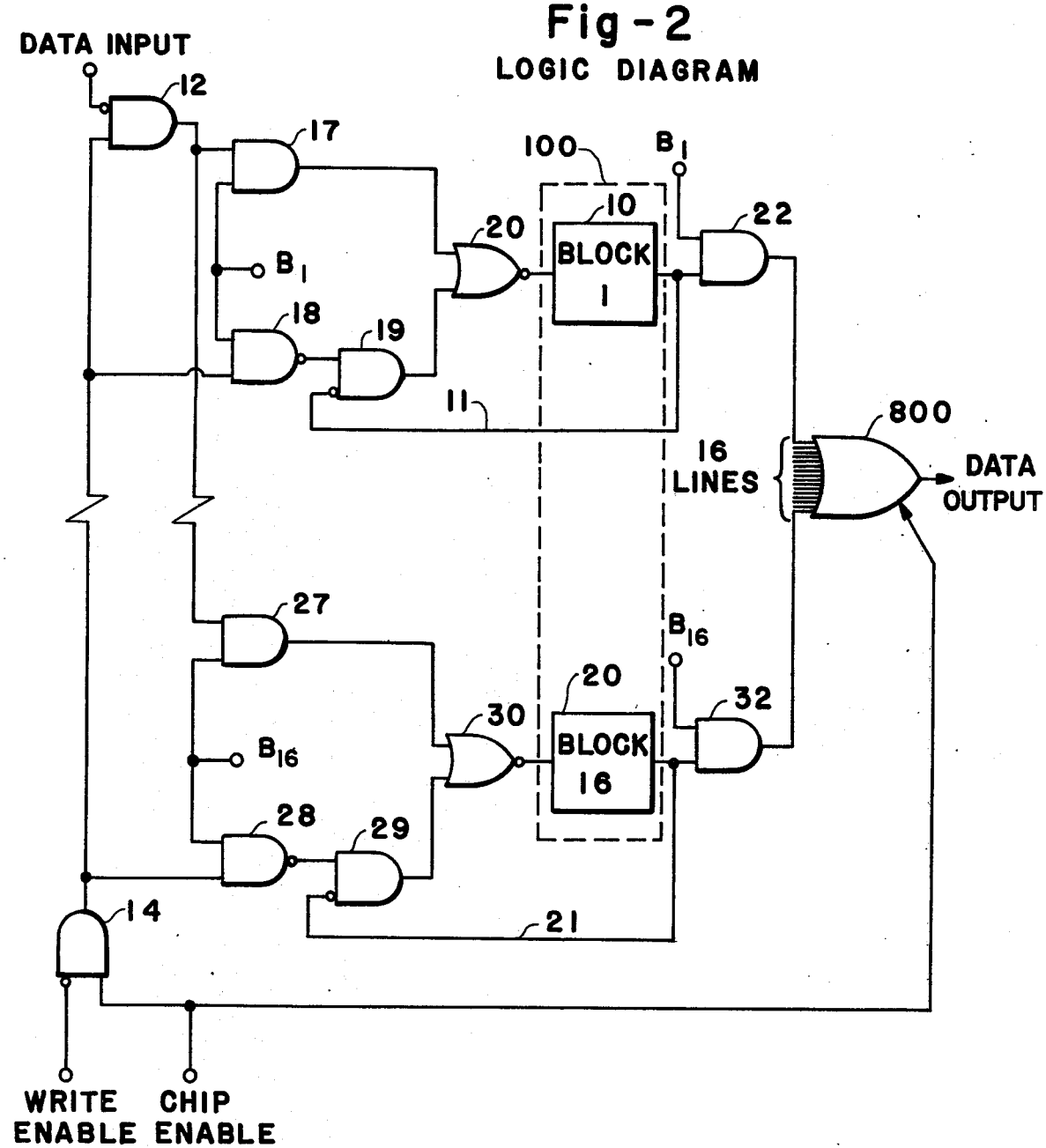
Fig-2
LOGIC DIAGRAM
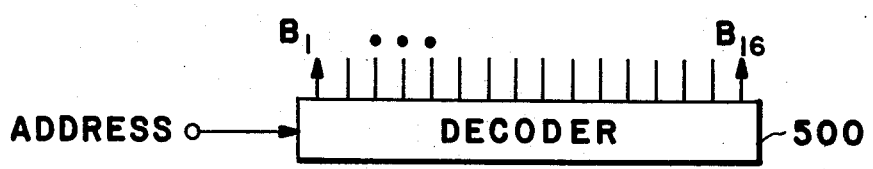

Fig-3 WRITE ENABLE LEVEL CONVERTER 920
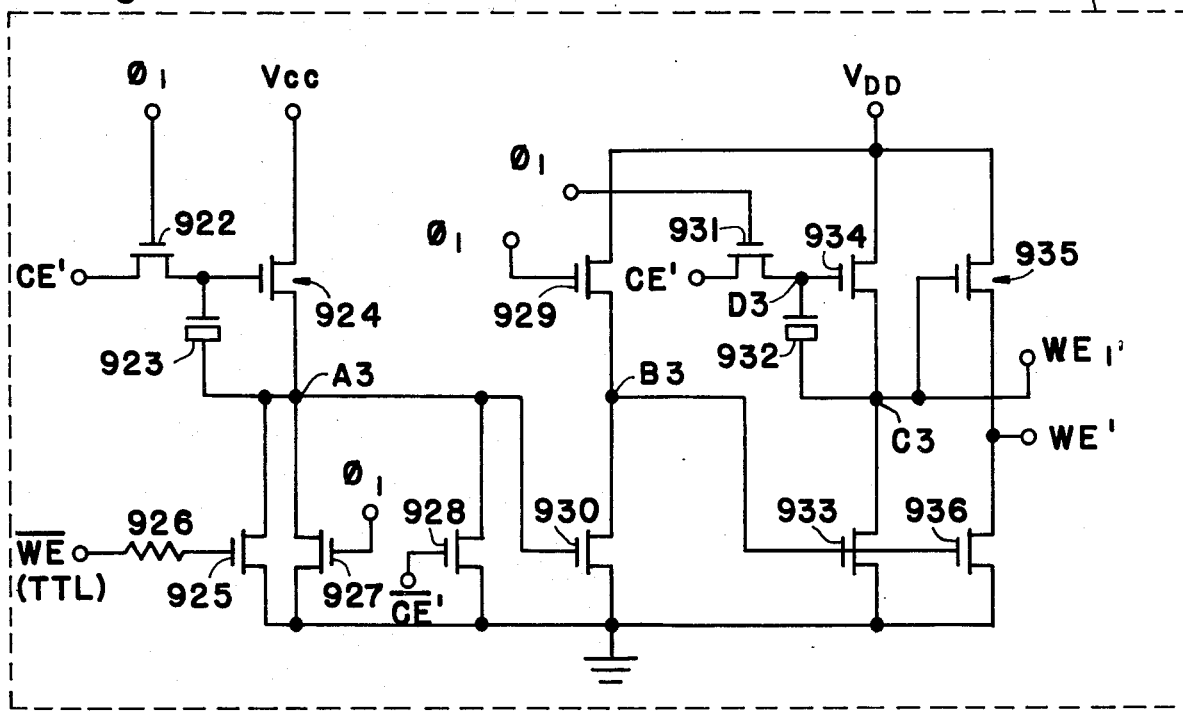
Fig-4 DATA INPUT LEVEL CONVERTER 900
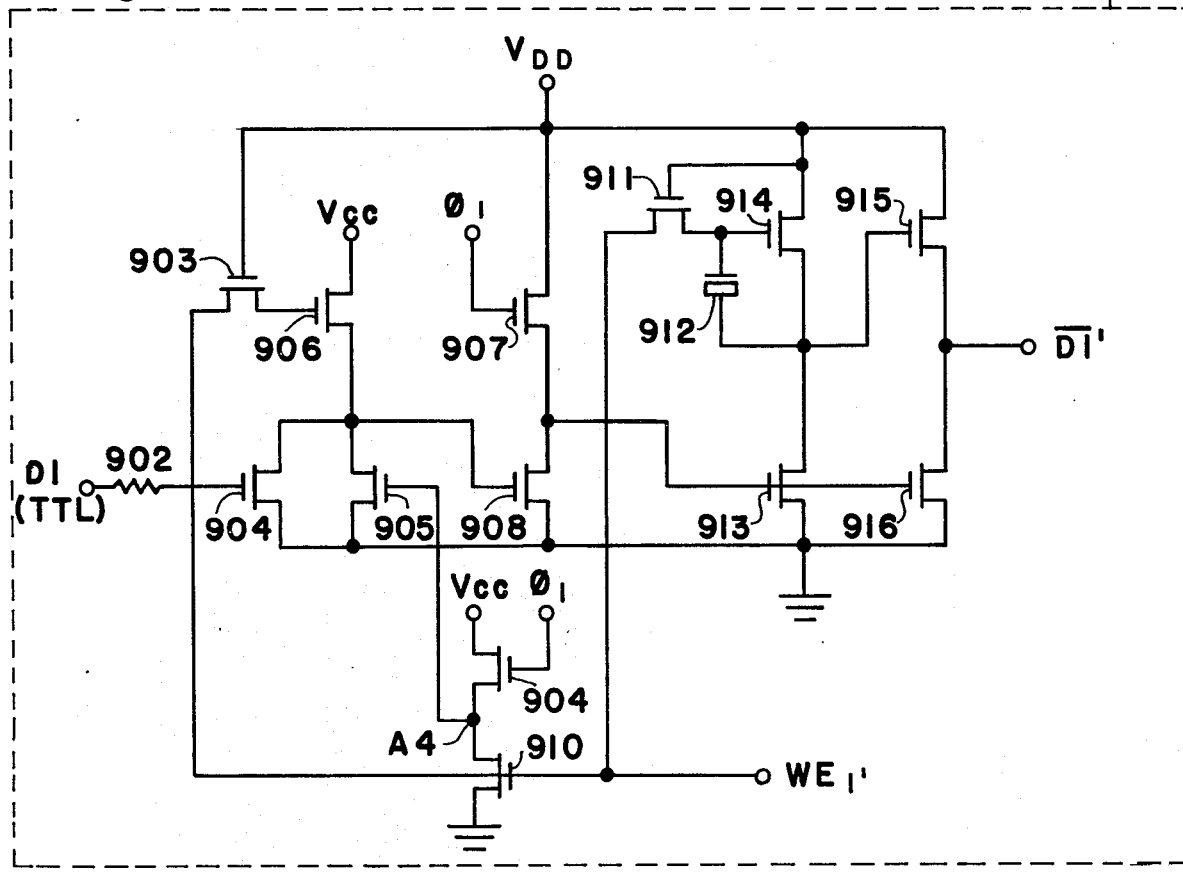

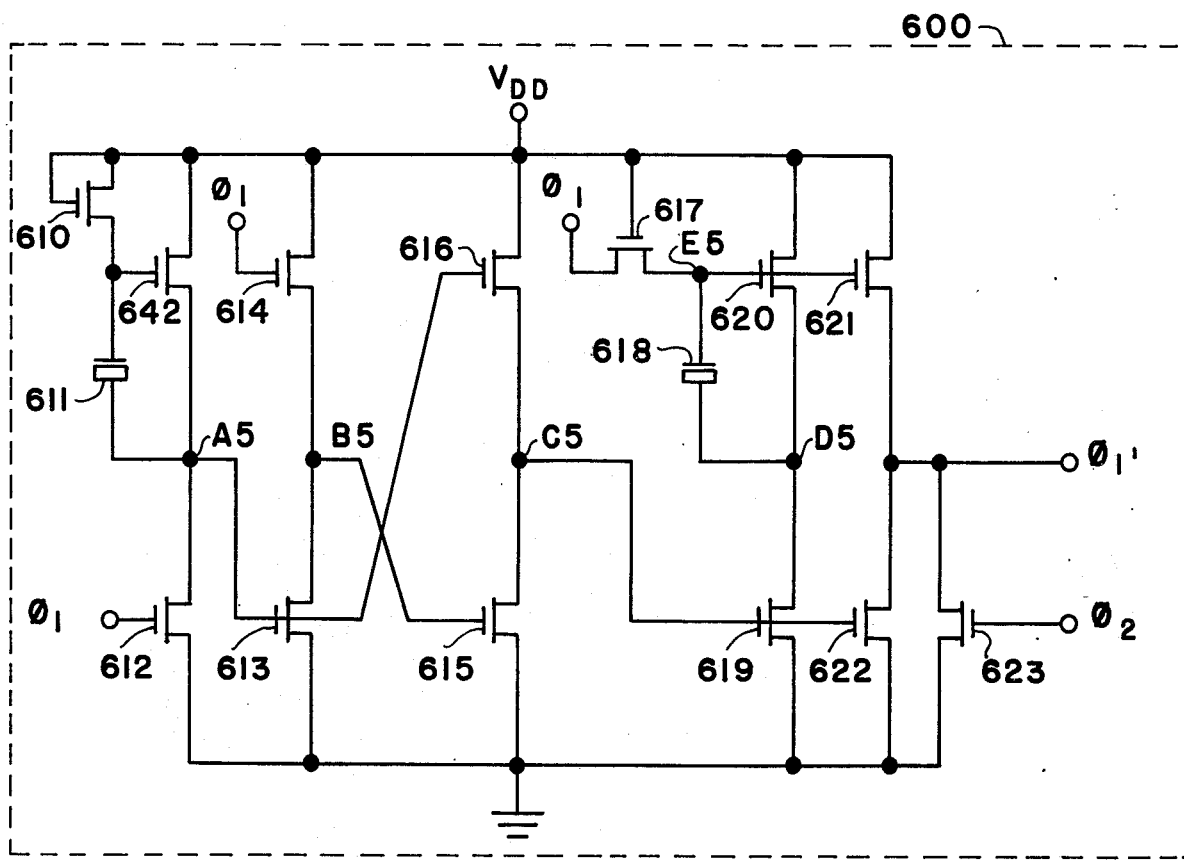
Fig-5a CLOCK DELAY ($\phi_1$)
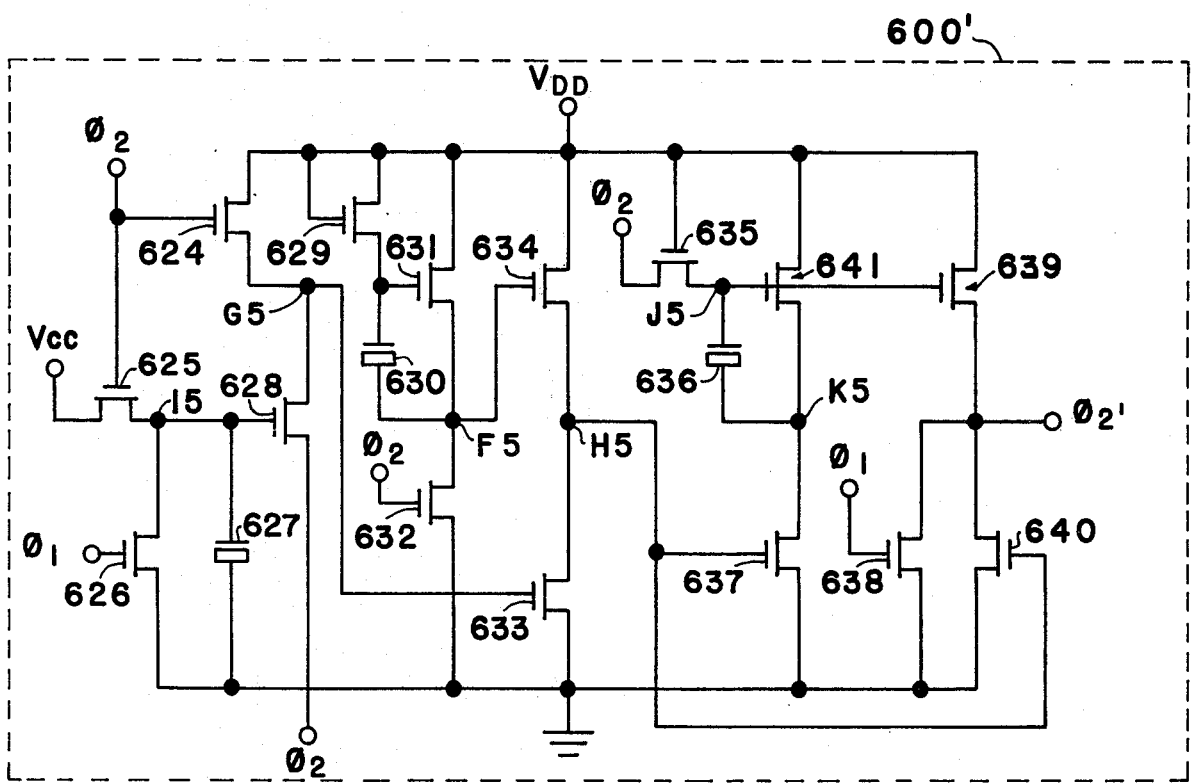
Fig-5b CLOCK DELAY ($\phi_2$)

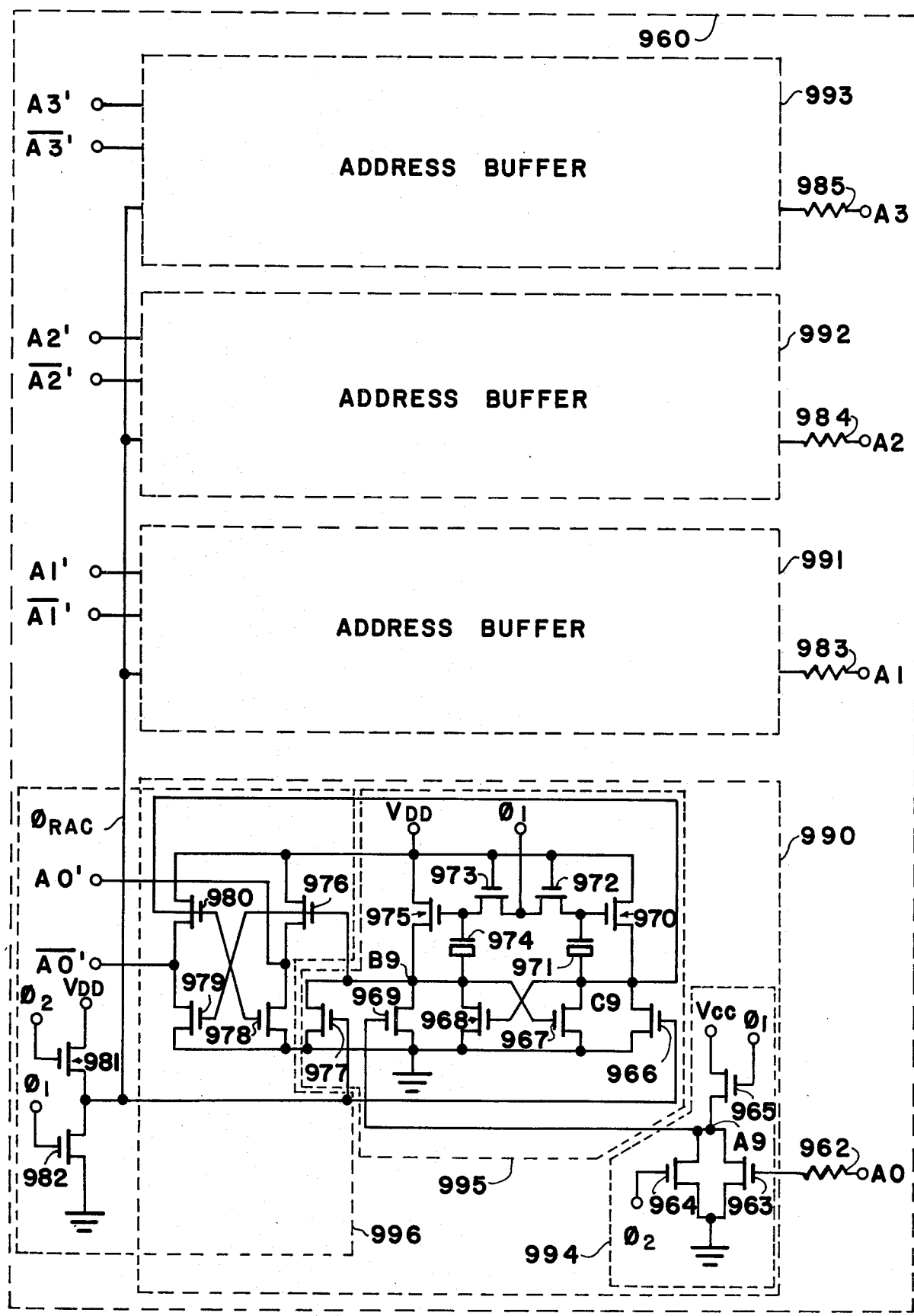
Fig-6  ADDRESS LEVEL CONVERTER

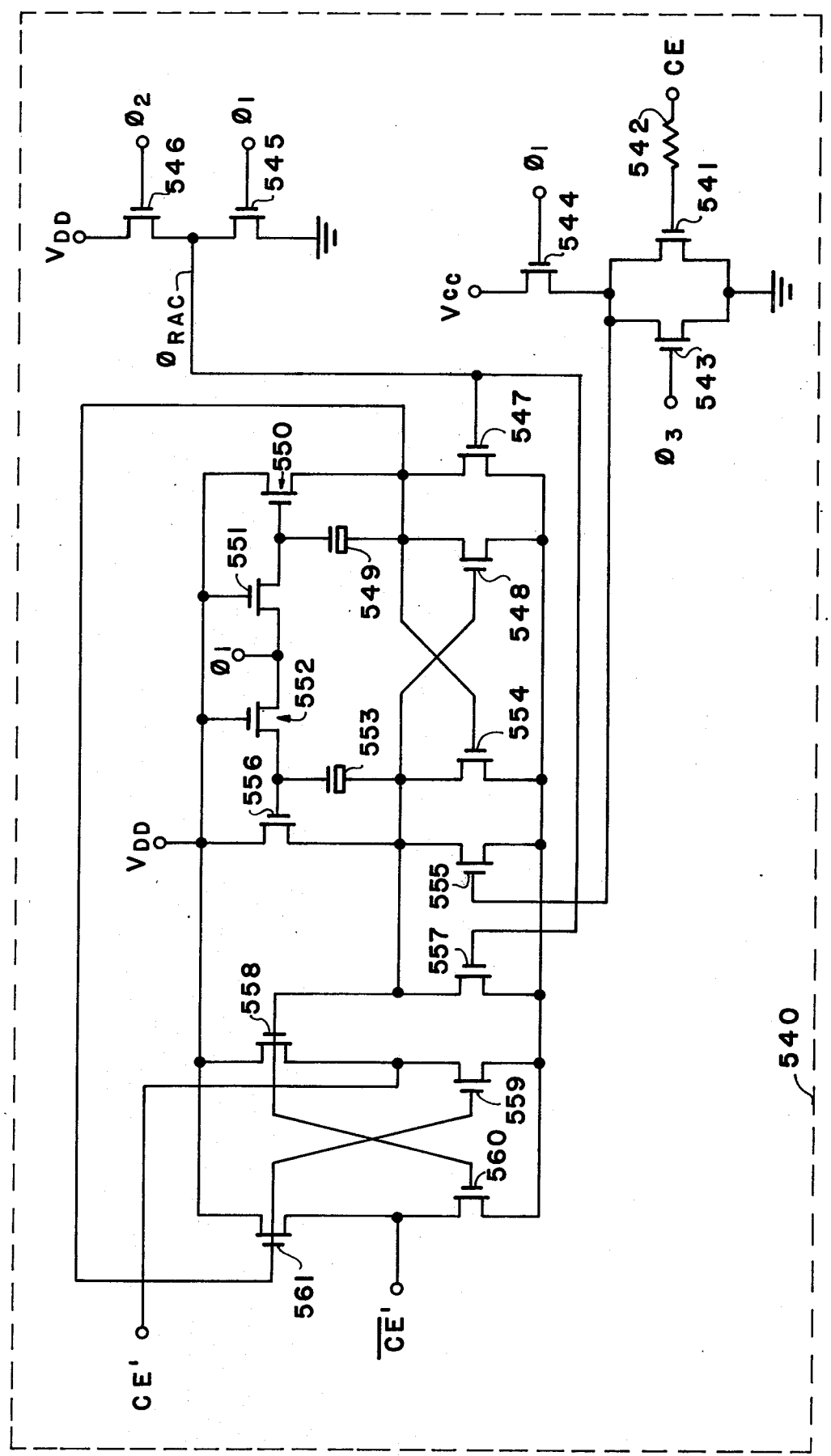
Fig-7  CHIP ENABLE LEVEL CONVERTER

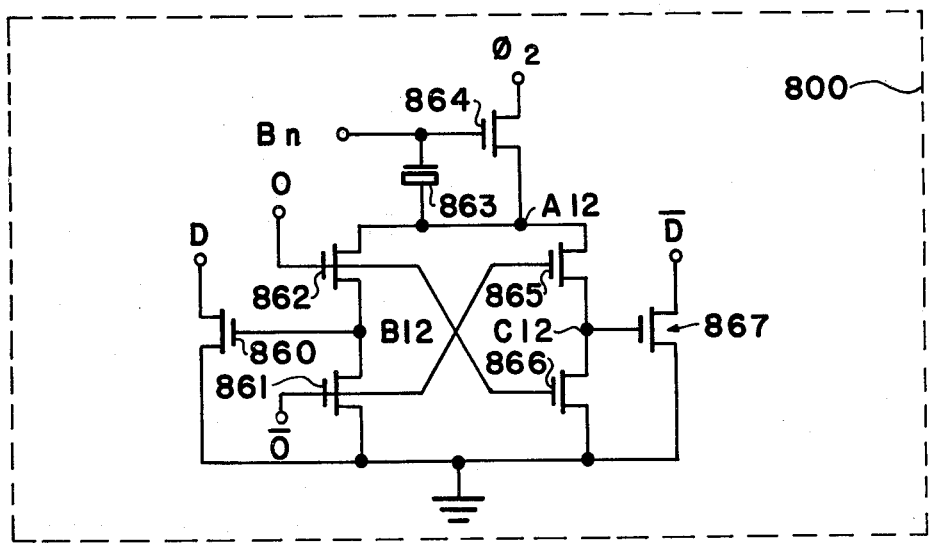
Fig-9 OUTPUT DECODER
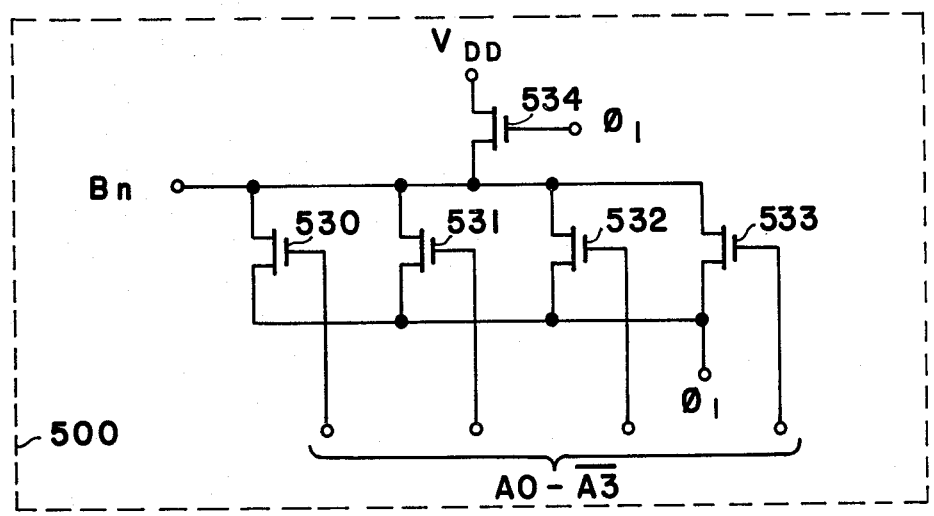
Fig-8a ADDRESS DECODER
Fig-8b
| DECODE TRUTH TABLE | | | | | | | |
|---|---|---|---|---|---|---|---|
| BLOCK | A0 | $\overline{A0}$ | A1 | $\overline{A1}$ | A2 | $\overline{A2}$ | A3 | $\overline{A3}$ |
| 1 | | X | | X | | X | | X |
| 2 | X | | | X | | X | | X |
| 3 | | X | X | | | X | | X |
| 4 | X | | X | | | X | | X |
| 5 | | X | | X | X | | | X |
| 6 | X | | | X | X | | | X |
| 7 | | X | X | | X | | | X |
| 8 | X | | X | | X | | | X |
| 9 | | X | | X | | X | X | |
| 10 | X | | | X | | X | X | |
| 11 | | X | X | | | X | X | |
| 12 | X | | X | | | X | X | |
| 13 | | X | | X | X | | X | |
| 14 | X | | | X | X | | X | |
| 15 | | X | X | | X | | X | |
| 16 | X | | X | | X | | X | |

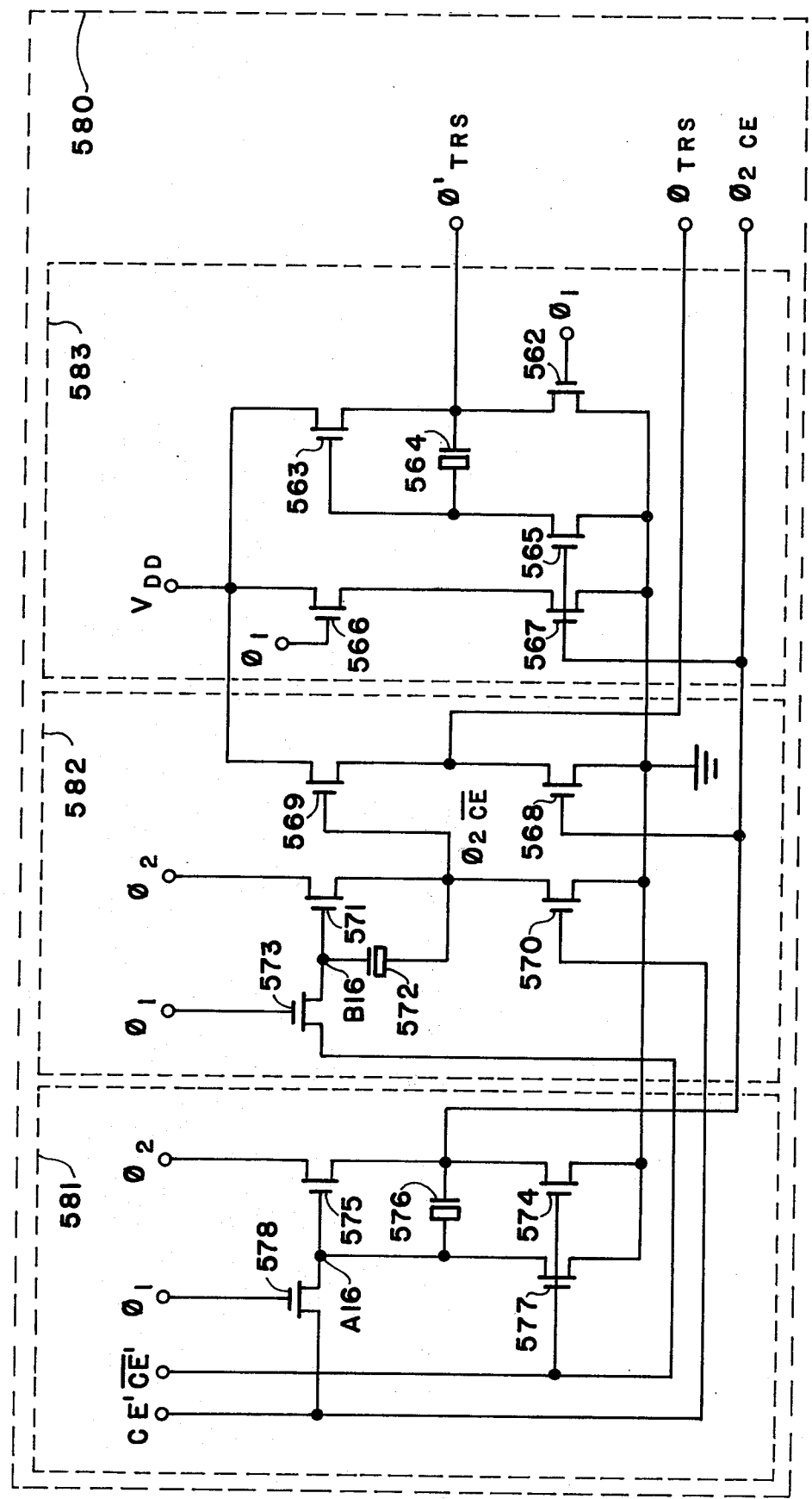
Fig-10 CLOCK GENERATOR

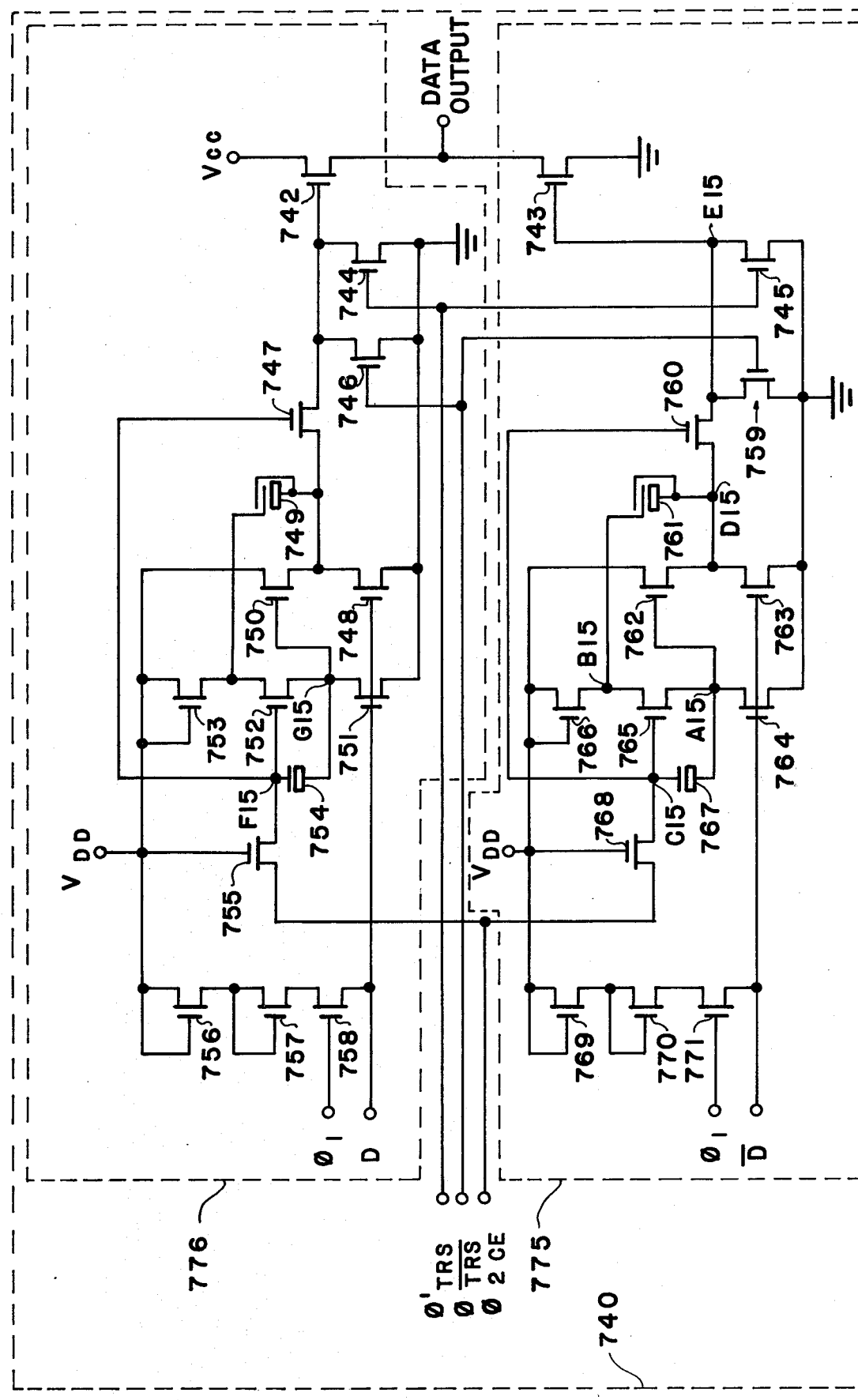
Fig-11 OUTPUT BUFFER

INPUT LOGIC

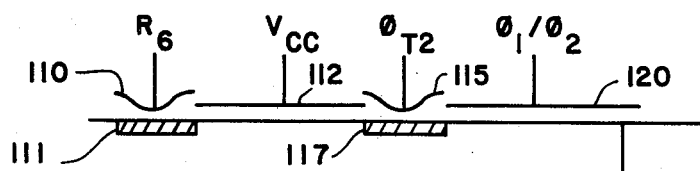
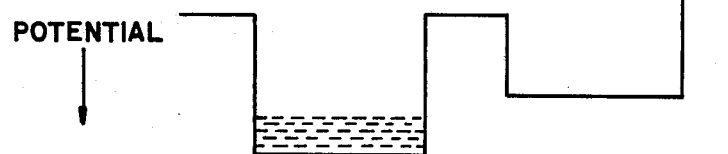
Fig-13b
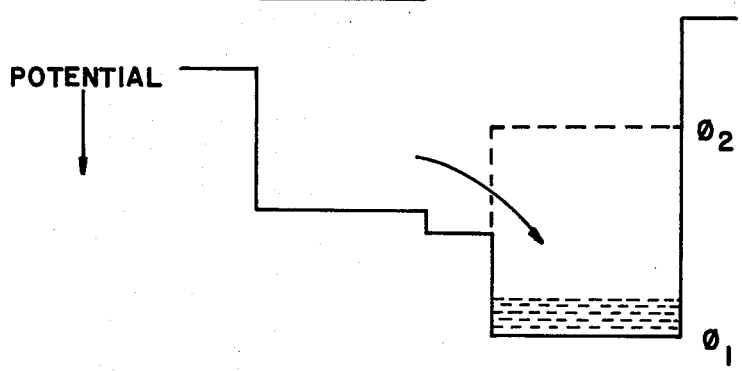
Fig-13c
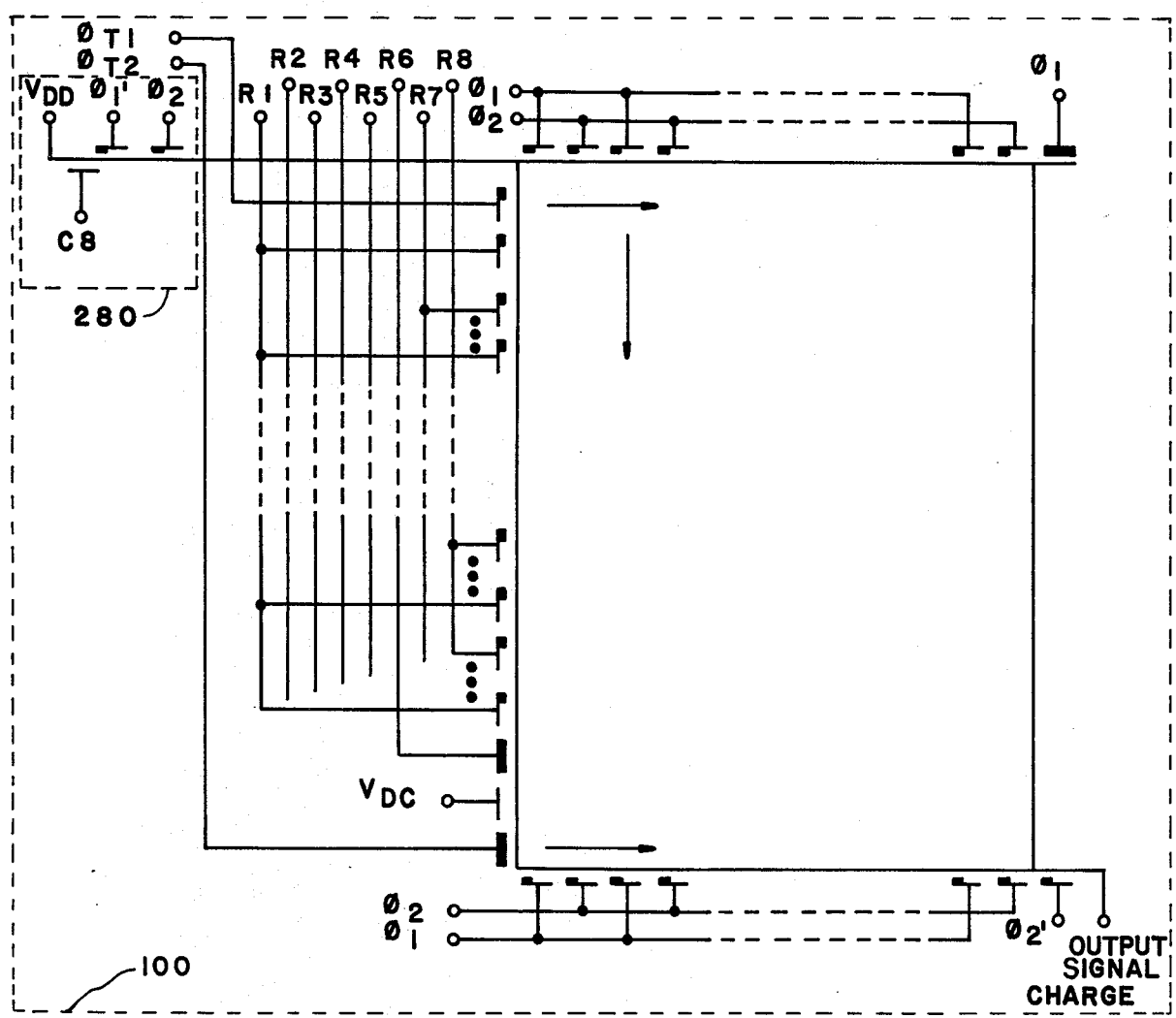
Fig-13a   CCD MEMORY ARRAY

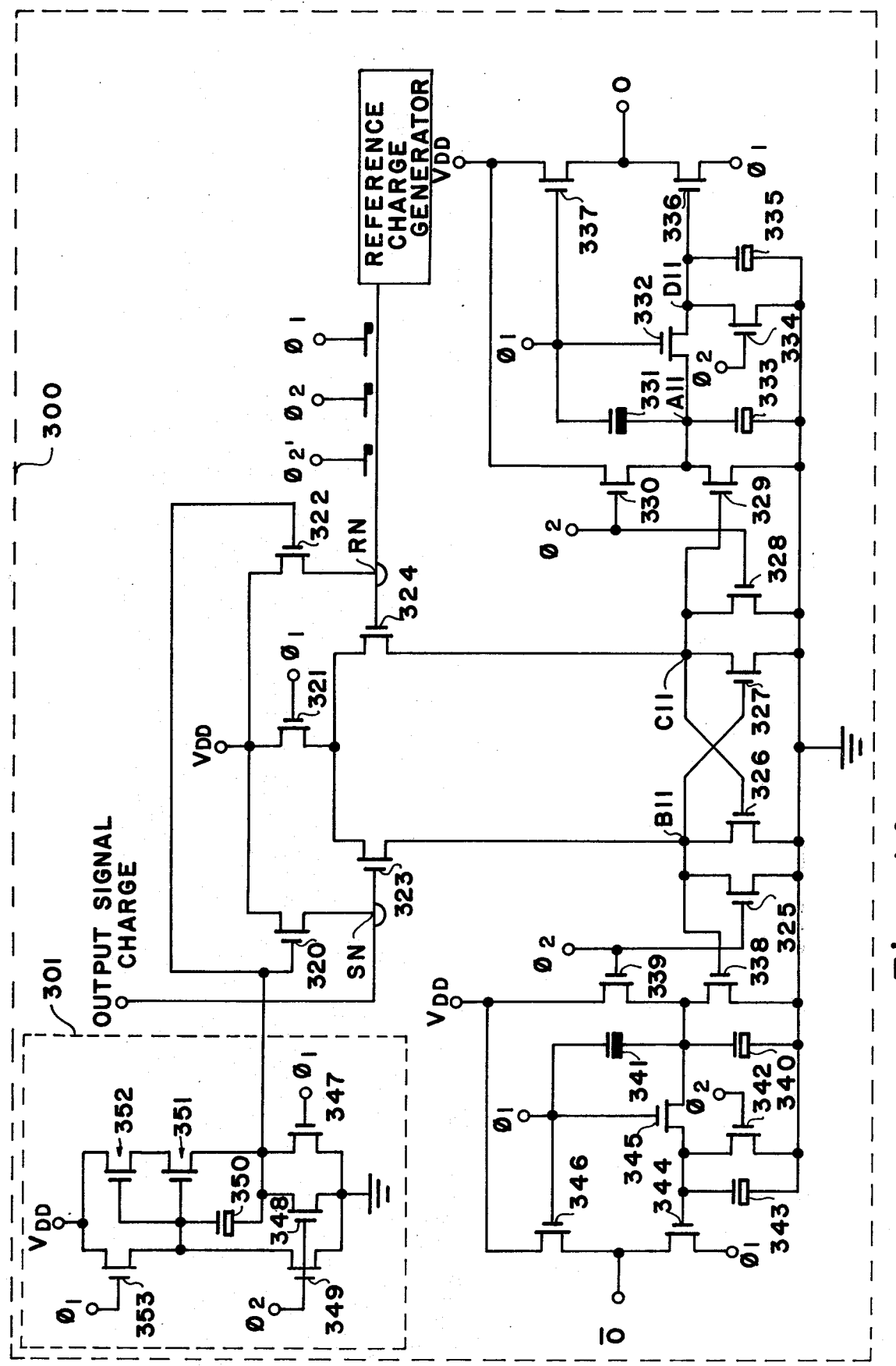
Fig-14a SENSE AMPLIFIER

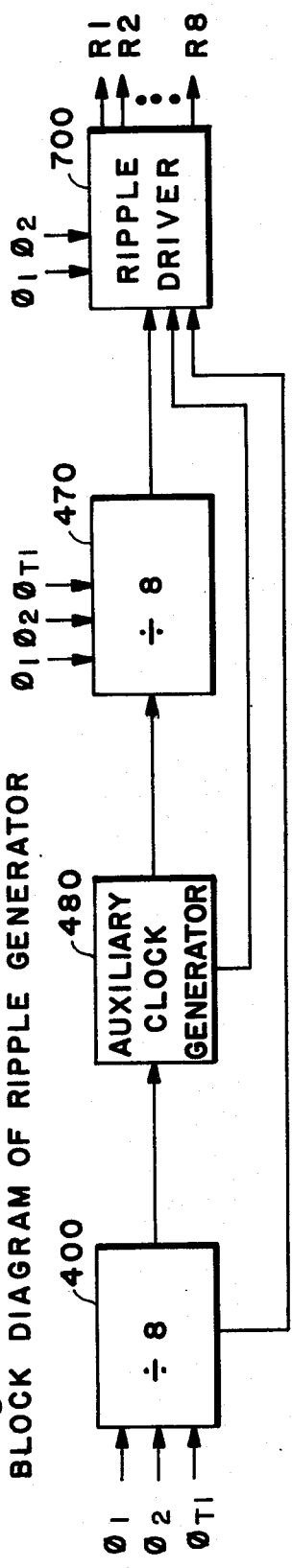
Fig-15
BLOCK DIAGRAM OF RIPPLE GENERATOR
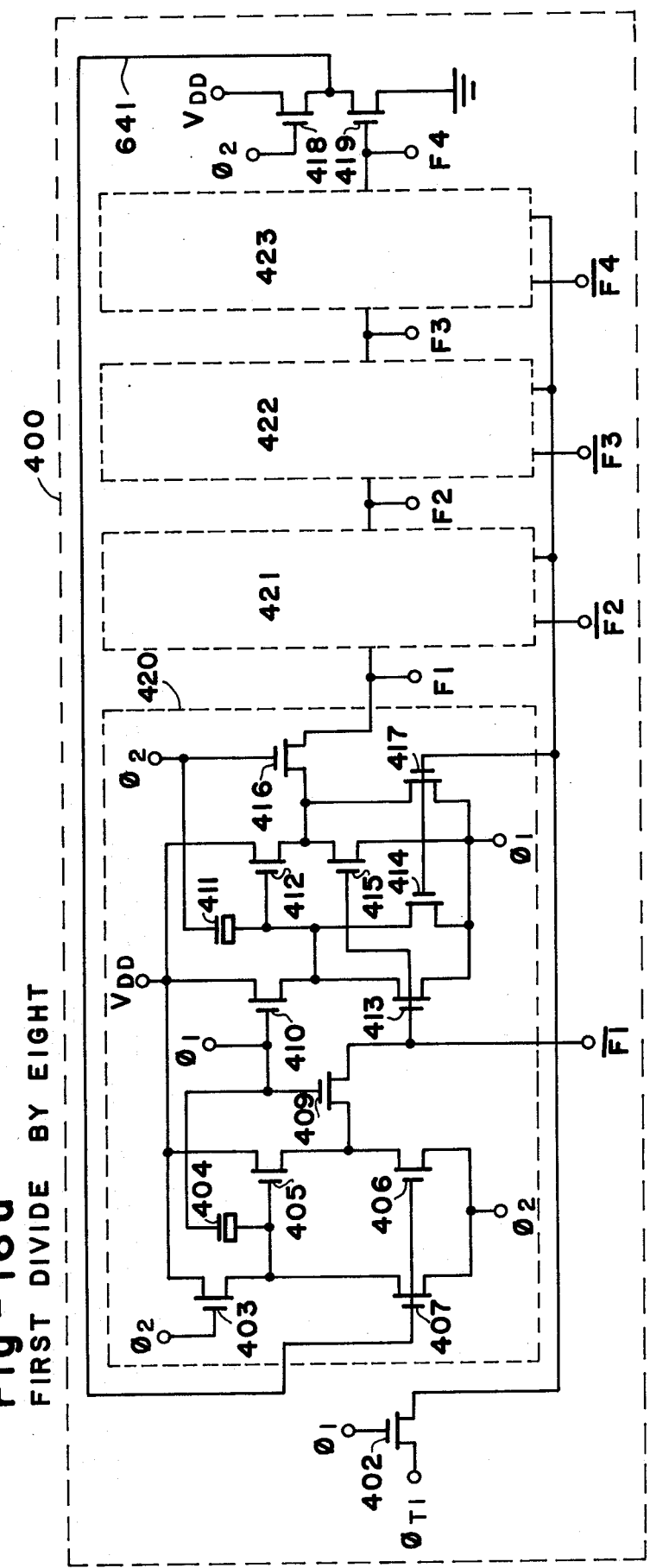
Fig-16a FIRST DIVIDE BY EIGHT

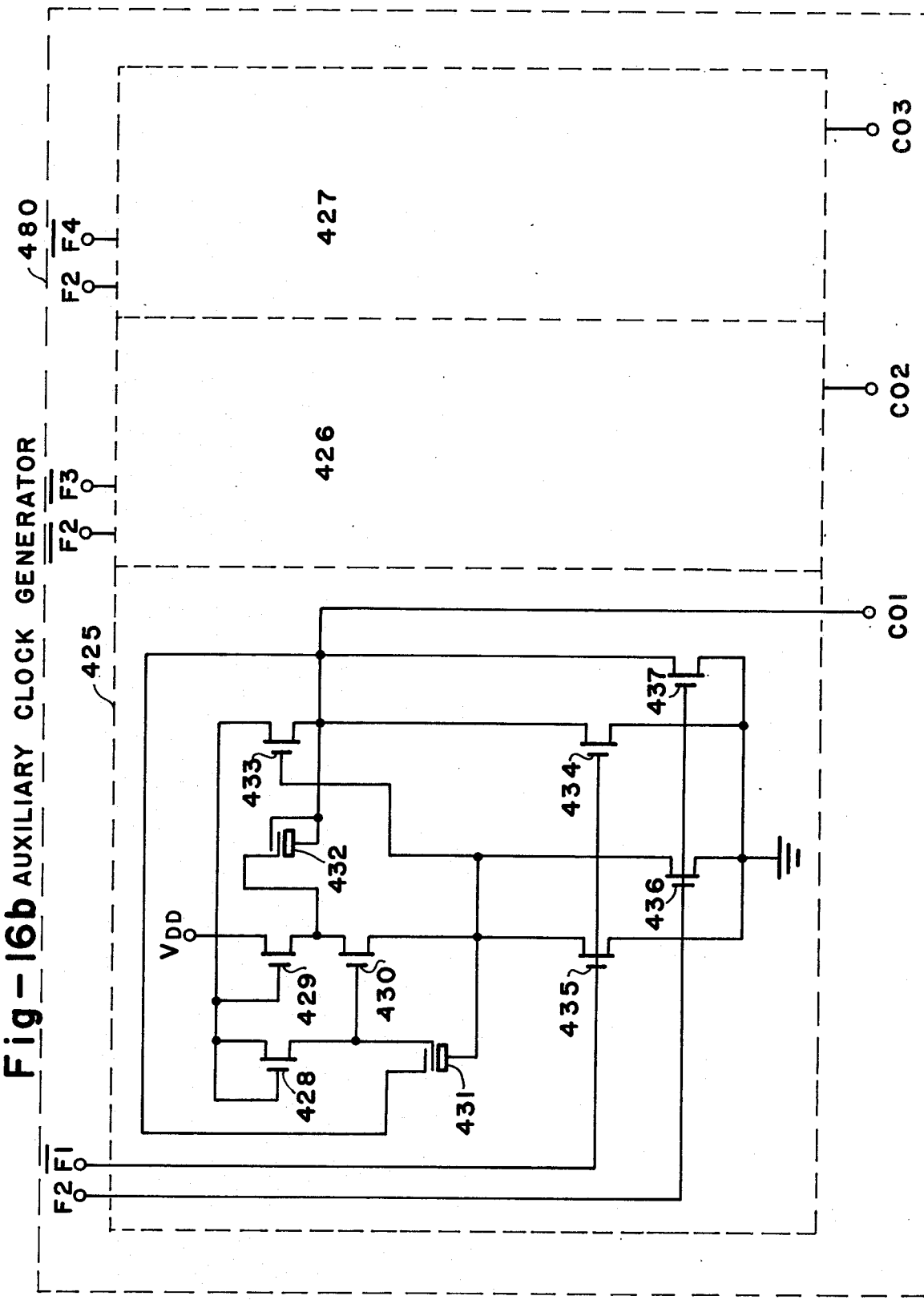
Fig-16b AUXILIARY CLOCK GENERATOR

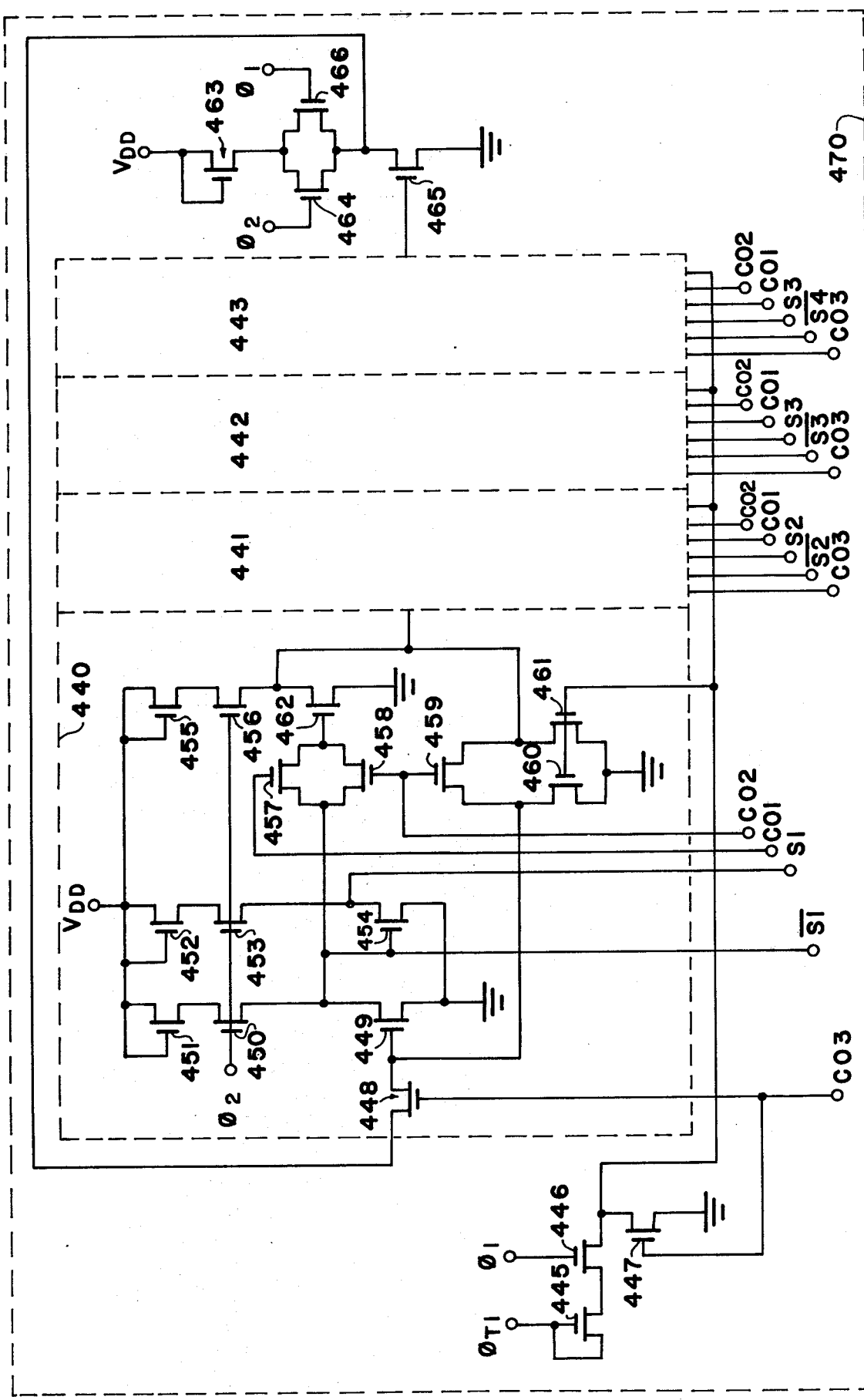
Fig-16c SECOND DIVIDE BY EIGHT

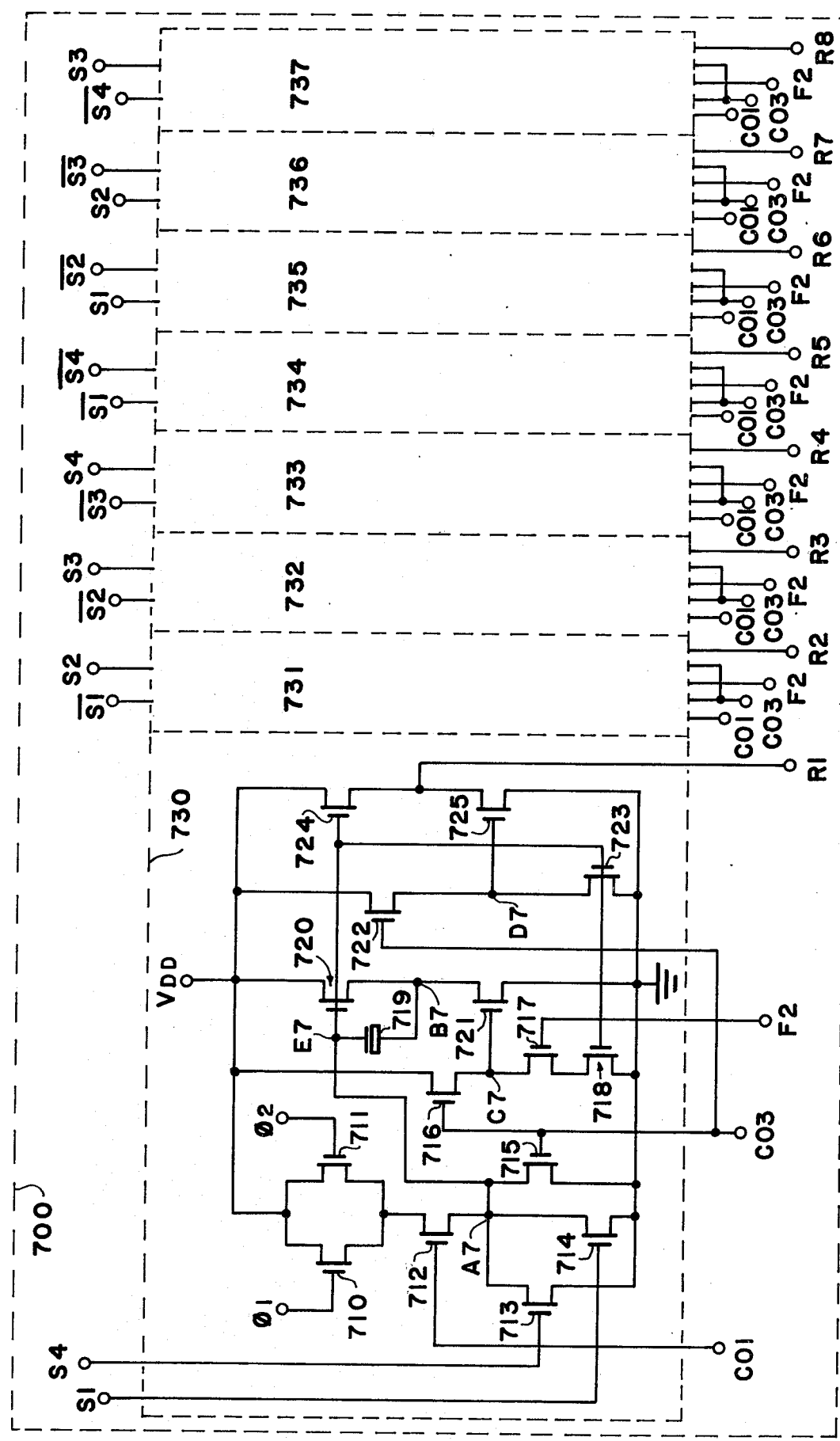
Fig-16d  RIPPLE DRIVER

Fig-17    CLOCK SYMBOLS

| SYMBOL | PARAMETER | MIN. | MAX. | UNITS |
|---|---|---|---|---|
| TEHEL | $\phi_1/\phi_2$ HIGH PULSE WIDTH | 65 | | ns |
| TELEH | $\phi_1/\phi_2$ UNDERLAP | 40 | | ns |
| TAVEH | ADDRESS SETUP TIME | 5 | | ns |
| TELAX | ADDRESS HOLD TIME | 5 | | ns |
| TSVEH | CHIP SELECT SETUP TIME | 5 | | ns |
| TELSX | CHIP SELECT HOLD TIME | 5 | | ns |
| TELQZ | DATA OUTPUT TURN-OFF TIME | | 50 | ns |
| TEHQV | ACCESS TIME | | 80 | ns |
| TWHEL | READ SETUP TIME | 0 | | ns |
| TELWX | READ/WRITE HOLD TIME | 0 | | ns |
| TWLEL | WRITE SETUP TIME | 100 | | ns |
| TDVWL | DATA SETUP TIME | 0 | | ns |
| TELDX | DATA HOLD TIME | 20 | | ns |
| TQVDV | RMW MODIFY TIME | 0 | | ns |
| TELTH | $\phi_1/\phi_2$ TO $\phi_{T2}$ SETUP TIME | 0 | | ns |
| TTHTL | $\phi_{T2}$ PULSE WIDTH | 30 | | ns |
| TEHTL | $\phi_{T2}$ TO $\phi_1/\phi_2$ OVERLAP | 30 | | ns |
| TTLEL | $\phi_{T2}$ TO $\phi_1/\phi_2$ SETUP TIME | 10 | | ns |
| TEHTH | $\phi_1/\phi_2$ TO $\phi_{T1}$ SETUP TIME | 0 | | ns |
| TTHEL | $\phi_{T1}$ TO $\phi_1/\phi_2$ OVERLAP | 30 | | ns |
| TELTL | $\phi_1/\phi_2$ TO $\phi_{T1}$ HOLD TIME | 10 | | ns |
| TTLEH | $\phi_{T1}$ TO $\phi_1/\phi_2$ SETUP TIME | 10 | | ns |
| $T_f$ | FALL TIME ($\phi_1$, $\phi_2$, $\phi_{T1}$, $\phi_{T2}$) | 10 | 50 | ns |
| $T_r$ | RISE TIME ($\phi_1$, $\phi_2$, $\phi_{T1}$, $\phi_{T2}$) | 10 | 50 | ns |
| f | FREQUENCY | 1.0 | 4.0 | MHZ |

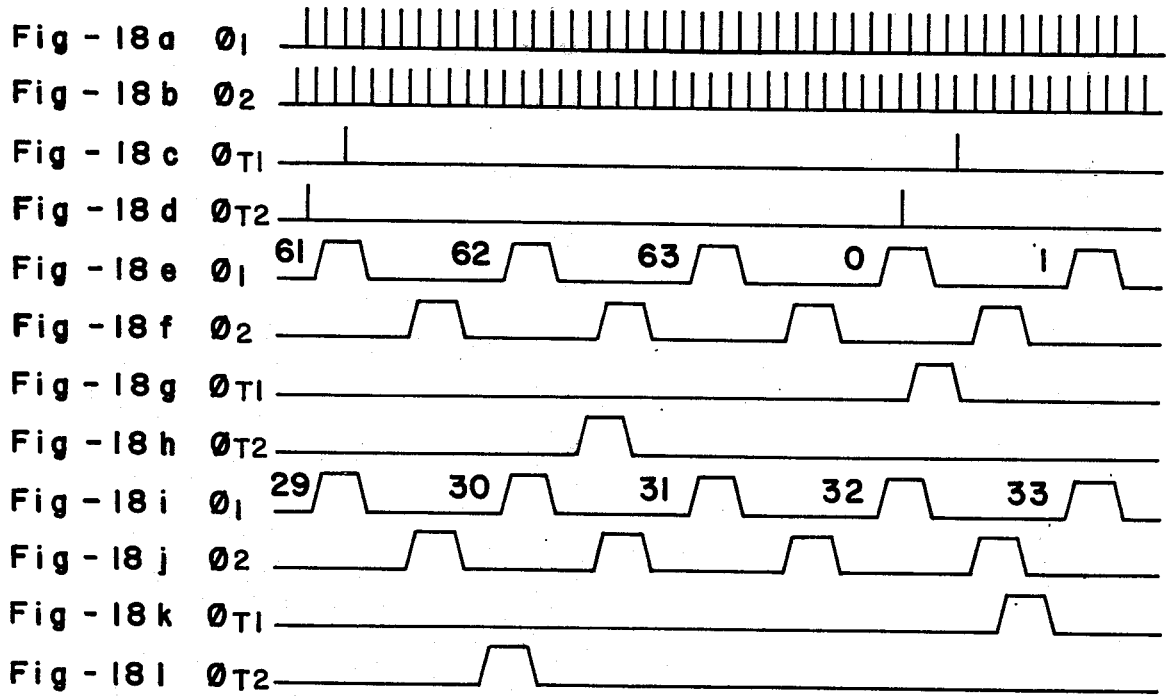
Fig-18 SYSTEM CLOCKS
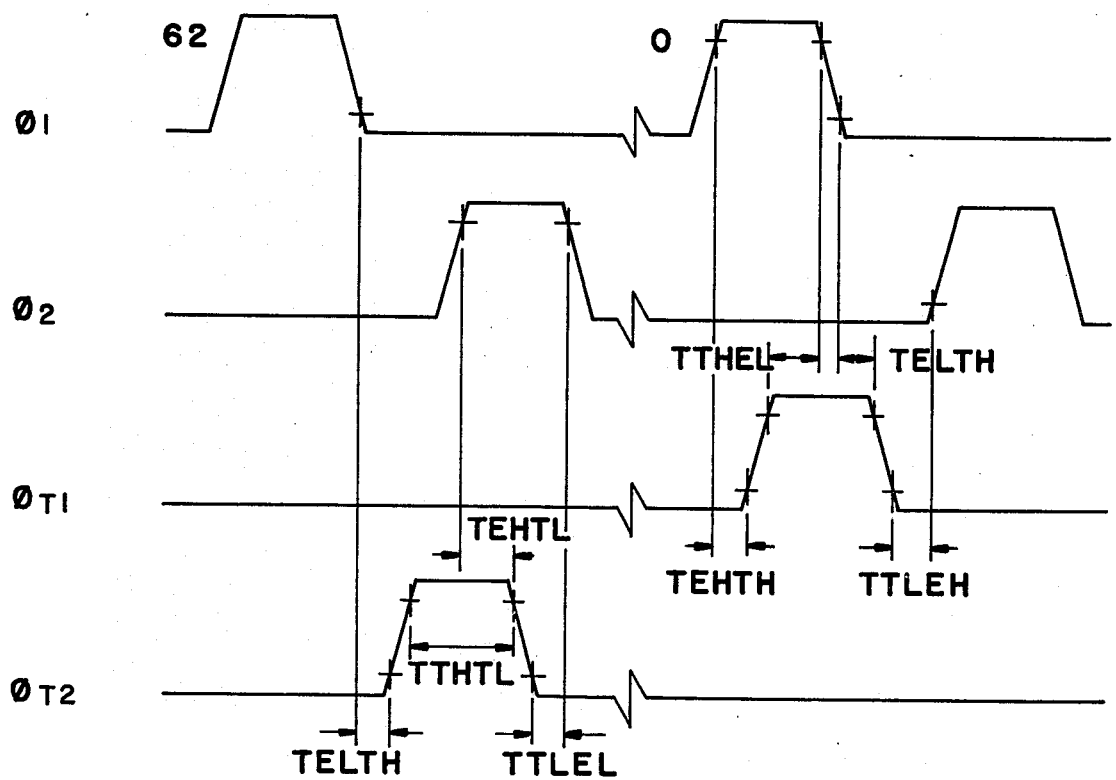
Fig-19 SYSTEM CLOCKS DETAIL

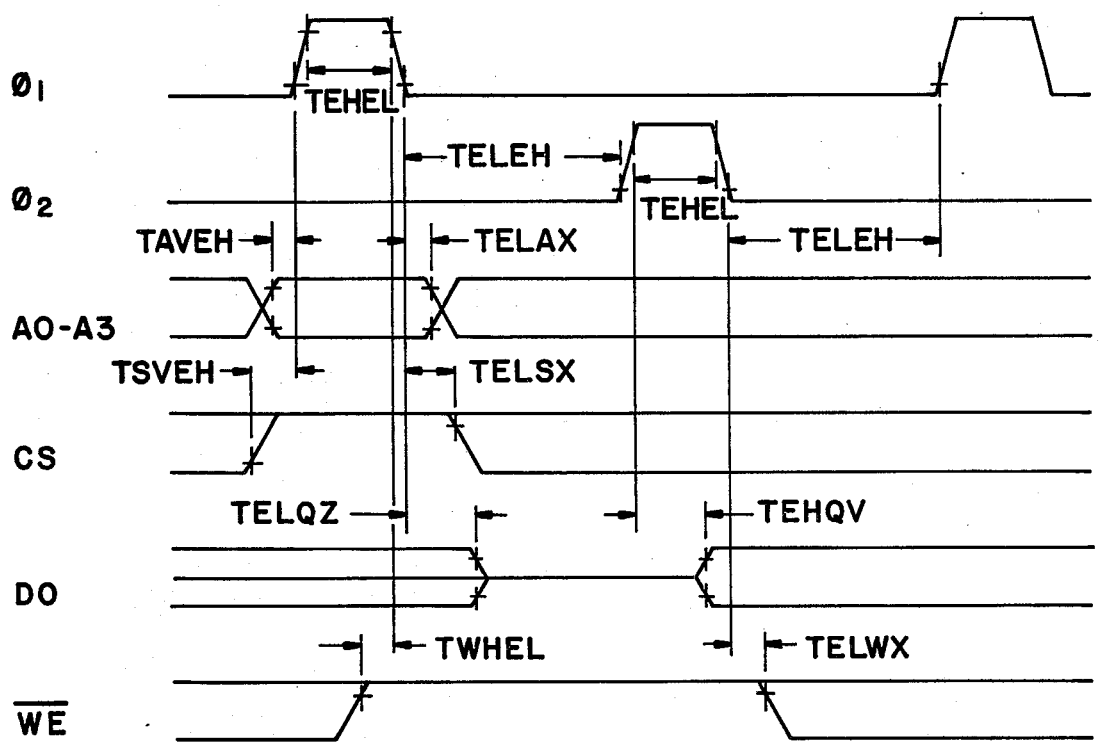
Fig-20  READ ONLY MODE
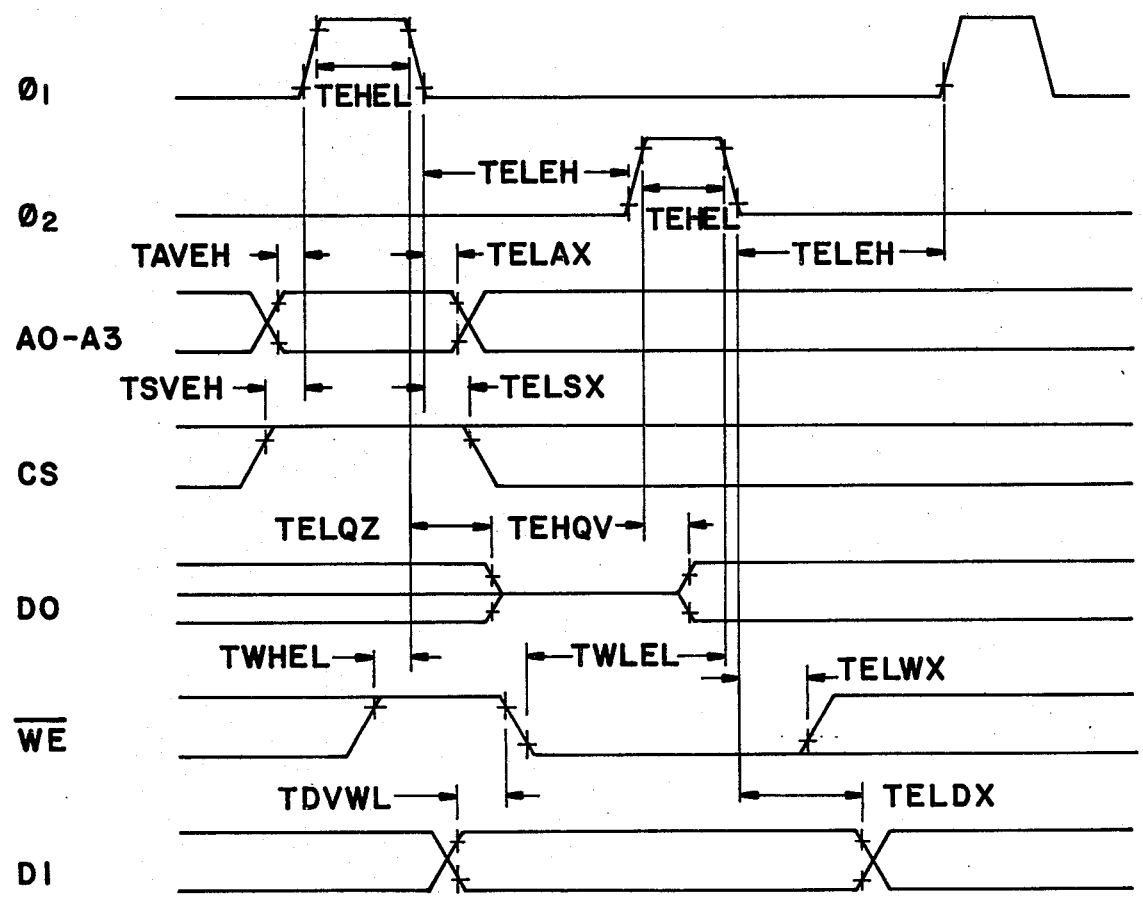
Fig-21  READ-WRITE MODE

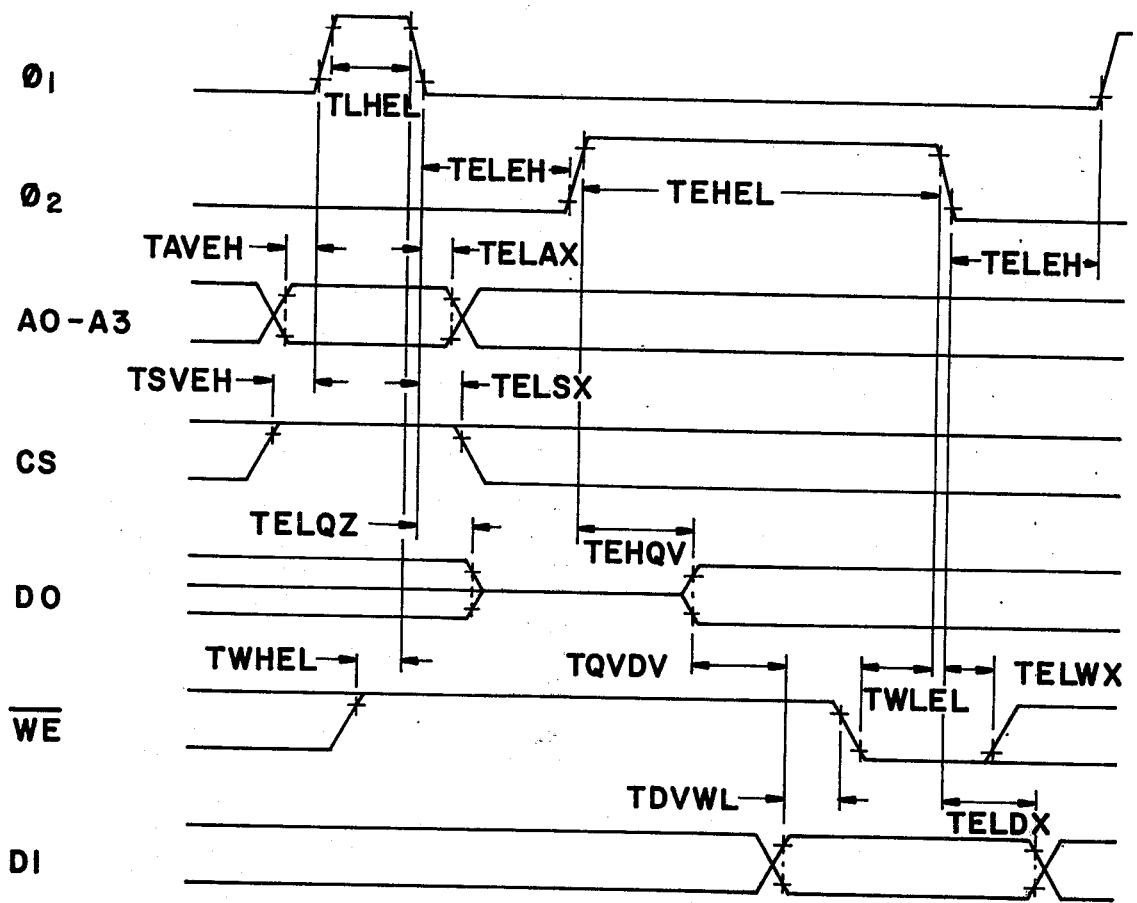
Fig-22 READ-MODIFY-WRITE MODE
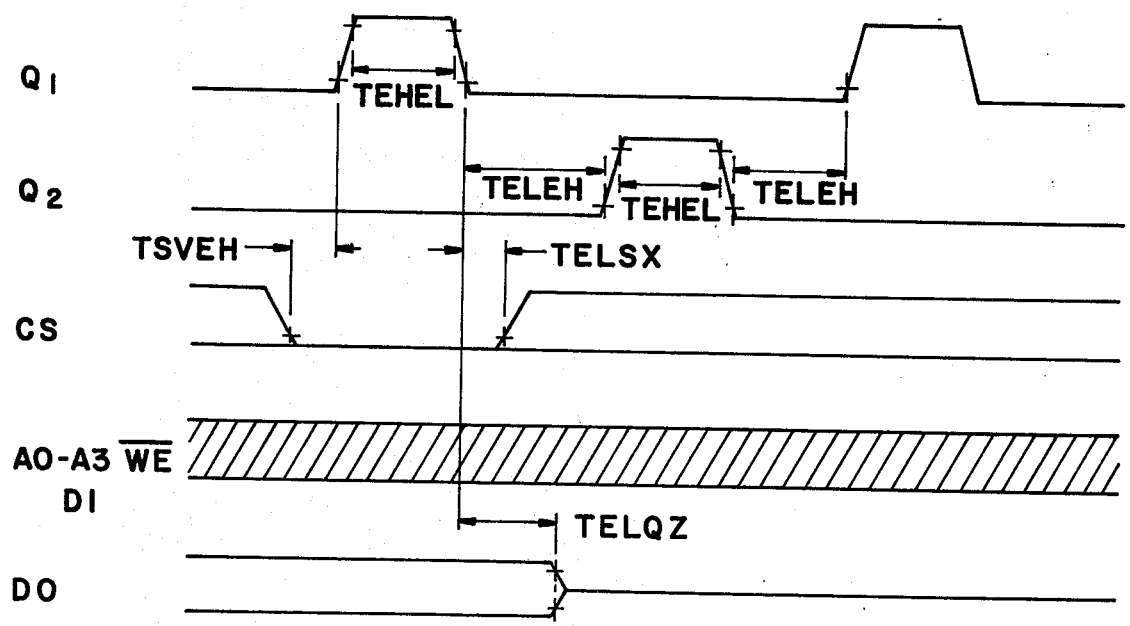
Fig-23 RECIRCULATE MODE

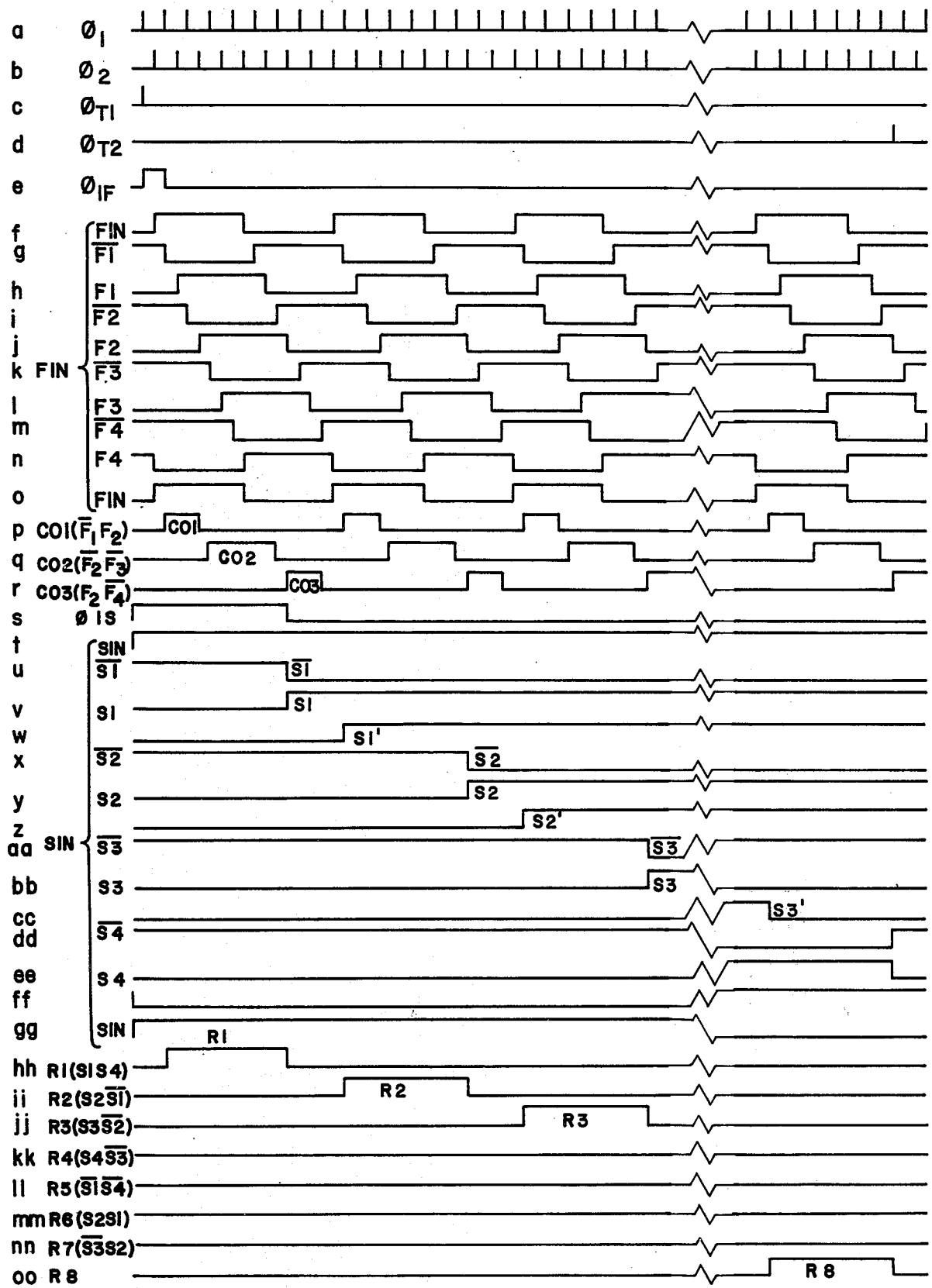
FIG-24  RIPPLE CLOCK SIGNALS

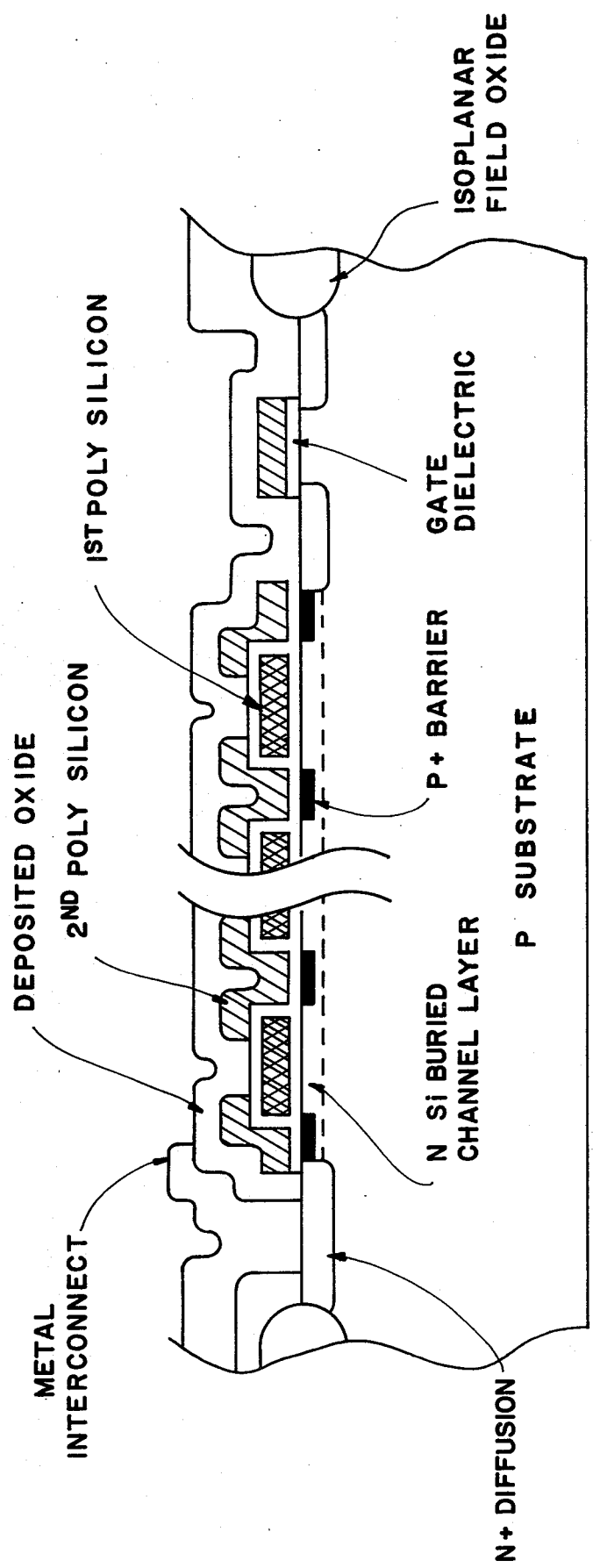
Fig-25 CROSS-SECTION OF ISOPLANAR CCD

SERIAL-PARALLEL-SERIAL CHARGE-COUPLED DEVICE MEMORY HAVING INTERLACING AND RIPPLE CLOCKING OF THE PARALLEL SHIFT REGISTERS

BACKGROUND OF THE INVENTION

1. Field of the Invention

This invention relates to memories fabricated from charge-coupled devices, and in particular, to a serial-parallel-serial organized CCD memory utilizing interlacing and ripple clocking of the parallel shift registers to achieve a high density of bits per unit area.

2. Description of the Prior Art

Charge-coupled semiconductor devices were first invented by W. S. Boyle and G. E. Smith. (See their paper, "Charge-Coupled Semiconductor Devices," Bell Systems Tech. Journal, Vol. 49, p. 587, and U.S. Pat. No. 3,858,232.) Since that time the development of charge-coupled devices (hereinafter referred to as CCD's) has been described in numerous publications. See, e.g., the article by Gilbert F. Amelio, "Charge-Coupled Devices," *Scientific American,* February 1974, Volume 230, No. 2, at page 23, and C. H. Sequin and M. F. Tompsett, *Charge Transfer Devices,* Academic Press, Inc., 1975. An early application of CCD's to memories was disclosed in "Charge-Coupled Digital Circuit," by W. F. Kosonocky and J. E. Carnes, published in *IEEE Journal of Solid-State Circuits,* Vol. SC-6., p. 314, 1971.

Memory structures fabricated with CCD technology typically use one or more shift registers operating in a first-in/first-out manner where all bits are simultaneously shifted. CCD memory elements can be formed by using these shift registers directly, or in combination with other circuitry to refresh, sense, or decode. There are at least three basic arrangements of CCD memory elements: serpentine, line-addressable and serial-parallel-serial. Serial-parallel-serial (herein SPS) CCD memories have a group of parallel shift registers with an input serial shift register at one end of the group and an output serial shift register at the opposite end of the group. Data are supplied to the input serial register at a rate determined by the clock frequency of the individual elements of the register. After the register is filled a serial-to-parallel transfer operation is performed to simultaneously shift all the information out of the serial input register into the input end elements of the parallel shift registers. Clock signals applied to the parallel shift registers cause the data to transfer along the registers toward the output end of each register. When the parallel registers are filled, data are transferred into the output serial shift register at the output end of the parallel registers. Clock signals of the same frequency as those applied to the input serial register are applied to the output serial register to shift data out of the CCD memory, typically through a sense amplifier and then to other circuitry as desired.

In most CCD SPS memories there are two elements of the input shift register for each parallel shift register, where an element consists of a barrier region and a storage region. It is known in the art, e.g. Sequin, supra p. 247, that a higher packing density can be achieved by using one parallel register for each element of the input or output serial shift register. This technique is known as interlacing. Using a two-phase electrode structure for the input and output registers, the information represented by the packets of charge may be transferred into (or from) the parallel registers at the correct phase so that charges are alternately introduced into (or removed from) every other one of the parallel registers. For example, the first storage location in the even-numbered parallel registers may be loaded by data from a first transfer from the input serial register, while the first storage element of the odd-numbered parallel registers may be loaded by a second transfer from the input serial register. A corresponding procedure is followed for transfer of the data from the parallel shift registers into the output serial shift register.

The packing density of the CCD SPS may be nearly doubled again by the use of ripple clocking, also known as "electrode-per-bit operation." This technique is also known. (See Sequin, supra, p. 247-49.) In a two-phase CCD there are normally two separate potential wells per bit of storage. In conventional two-phase operation only one of each pair of wells is used to store information so that an empty well precedes and follows each well in which information is stored to provide a new empty location to which charge may be transferred. By storing information in both potential wells of each element of each shift register except for one well in a given series of wells, the packing density may be nearly doubled because data may be shifted forward by moving a blank well progressively backward along the shift register. In this manner each packet of charge is advanced one electrode as the blank well passes. The resulting motion of the charges stored in the CCD elements is slow, but in many applications the slowness is not necessarily undesirable. One such application is in serial-parallel-serial CCD memories used for storage of large quantities of information.

An SPS CCD memory utilizing both interlacing and ripple clocking of the parallel shift registers is described by S. D. Rosenbaum et al in an article entitled, "A 16,384-Bit High Density CCD Memory," published in *IEEE Transactions on Electron Devices,* February 1976, at page 101. A 64k-bit CCD memory with ripple clocking is described in an article entitled, "A New Multiplexed Electrode Per-Bit Structure for a 64k-Bit Charge-Coupled-Device Memory," by S. Kohyama et al, *IEEE Journal of Solid-State Circuits,* Vol. SC-12, No. 4, August 1977.

SUMMARY OF THE INVENTION

This invention provides a serial-parallel-serial CCD memory utilizing interlacing and ripple clocking of the parallel registers to achieve a high data storage density per unit area. In one embodiment the memory consists of 65,536 bits which are organized into a format of 16 blocks of 4,096 bits. Data in all the 16 blocks are advanced simultaneously at the rate of one bit per cycle. Four address bits select which of the 16 blocks is accessible to the data input or output terminals.

Data are shifted in the memory by four clocks, two of which operate at a frequency equal to the data rate and two of which operate at a slower frequency equal to 2/n where n is the number of parallel registers in a block, in one embodiment n=64. The main clocks are used to shift data within the input and output serial registers of each block. A first transfer clock is used to transfer data in all blocks from the serial input register to the parallel storage registers, while the second transfer clock is used to transfer data in all blocks from the parallel storage registers to the serial output register. The data within the parallel shift registers includes interspersed blank potential wells so that the data within the parallel shift registers may be shifted by eight different ripple clock signals.

The CCD memory of this invention incorporates several features not previously known which provide substantial advantages over the prior art structures. An improved sense amplifier design allows sensing the output signals from the CCD memory registers with increased dynamic margin for buried-channel CCD structures.

A new input charge writing technique is used where the charge is written directly from the power supply potential $V_{DD}$ rather than from an intermediate voltage level generated by additional circuitry. A voltage lower than $V_{DD}$ has been used in the prior art (e.g., "A Byte-Organized NMOS/CCD Memory with Dynamic Refresh Logic," by R. C. Varshney et al, *IEEE Journal of Solid-State Circuits*, Vol. SC-11, No. 1, February 1976.) The technique of this invention avoids the generation of a new voltage level which may vary depending upon the process parameters used in fabricating the intermediate supply. Using $V_{DD}$ as the input-charge source avoids the problem.

Output decoding is done by a dynamic AND gate where three devices are used to obtain the AND function of two signals. One device is connected to receive a signal $B_n$ designating the addressed block of 16k bits while the other two devices are connected to a signal and its complementary signal, for example, O and $\overline{O}$ designating the charge state (logical 0 or 1) of the data output. If O, $\overline{O}$ and $B_n$ are made unconditionally high during the desired clock, e.g., $\phi_1$, time, the output node of the AND gate is discharged to ground. Before the next clock signal $\phi_2$, O, $\overline{O}$ and $B_n$ become valid depending upon the data from the CCD and address bits. Hence the output of the AND gate is usually low and goes high only when both O and $B_n$ are high. Therefore, no DC current is drawn from the $\phi_2$ clock because one of the O and $\overline{O}$ signals is always low when $\phi_2$ is high.

DESCRIPTION OF THE DRAWINGS

FIG. 2 is a logic diagram showing the manner of operation of the data input, write enable, chip enable, address and output signals of one embodiment of this invention.

FIG. 3 is a schematic of a particular write enable level converter circuit.

FIG. 4 is a schematic of a particular data input level converter circuit

FIG. 5a is a schematic of a particular $\phi_1'$ clock generator circuit. FIG. 5b is a schematic of a particular $\phi_2'$ clock generator circuit.

FIG. 6 is a schematic of a particular address level converter circuit.

FIG. 7 is a schematic of a particular chip enable level converter circuit.

FIG. 8a is a schematic of a particular address decoder circuit.

FIG. 8b is an example of a decode truth table for FIG. 13a.

FIG. 9 is a schematic of a particular output decoder circuit.

FIG. 10 is a schematic of a particular clock generator circuit.

FIG. 11 is a schematic of a particular output buffer circuit.

FIG. 13a is a schematic of a particular SPS array of CCD storage elements, including an input charge writing apparatus.

FIGS. 13b and 13c illustrate the manner in which charge is transferred from every other one of the parallel registers into the serial output register.

FIG. 14a is a schematic of a particular sense amplifier circuit.

FIGS. 14b and 14c are potential diagrams of the sense amplifier output gate shown in FIG. 14a.

FIG. 14e is a schematic of the reference charge generator circuit used with the sense amplifier shown in FIG. 14a.

FIG. 15 is a block diagram of the ripple generator.

FIG. 16a is a schematic of a first dividing circuit.

FIG. 16b is a schematic of a particular auxiliary clock generator circuit.

FIG. 16c is a schematic of a particular second dividing circuit.

FIG. 16d is a schematic of a particular ripple driver circuit.

FIG. 17 is a table of the symbols of the signals used in FIGS. 18 through 23.

FIG. 18 is a timing diagram showing the relationship of the system clock signals $\phi_1$, $\phi_2$, $\phi_{T1}$ and $\phi_{T2}$.

FIG. 19 is a detailed timing diagram of the signals shown in FIG. 18.

FIG. 20 is a timing diagram of certain system signals during the read only mode of operation.

FIG. 21 is a timing diagram of certain system signals during the read-write mode of operation.

FIG. 22 is a timing diagram of certain system signals during the read-modify-write mode of operation.

FIG. 23 is a timing diagram of certain system signals during the recirculate mode of operation.

FIGS. 24a to 24oo are a series of timing diagrams showing the relationship of the ripple clock signals with other system signals.

FIG. 25 is a cross-section of an isoplanar CCD.

DETAILED DESCRIPTION

SYSTEM BLOCK DIAGRAM—FIG. 1

Figure 1:
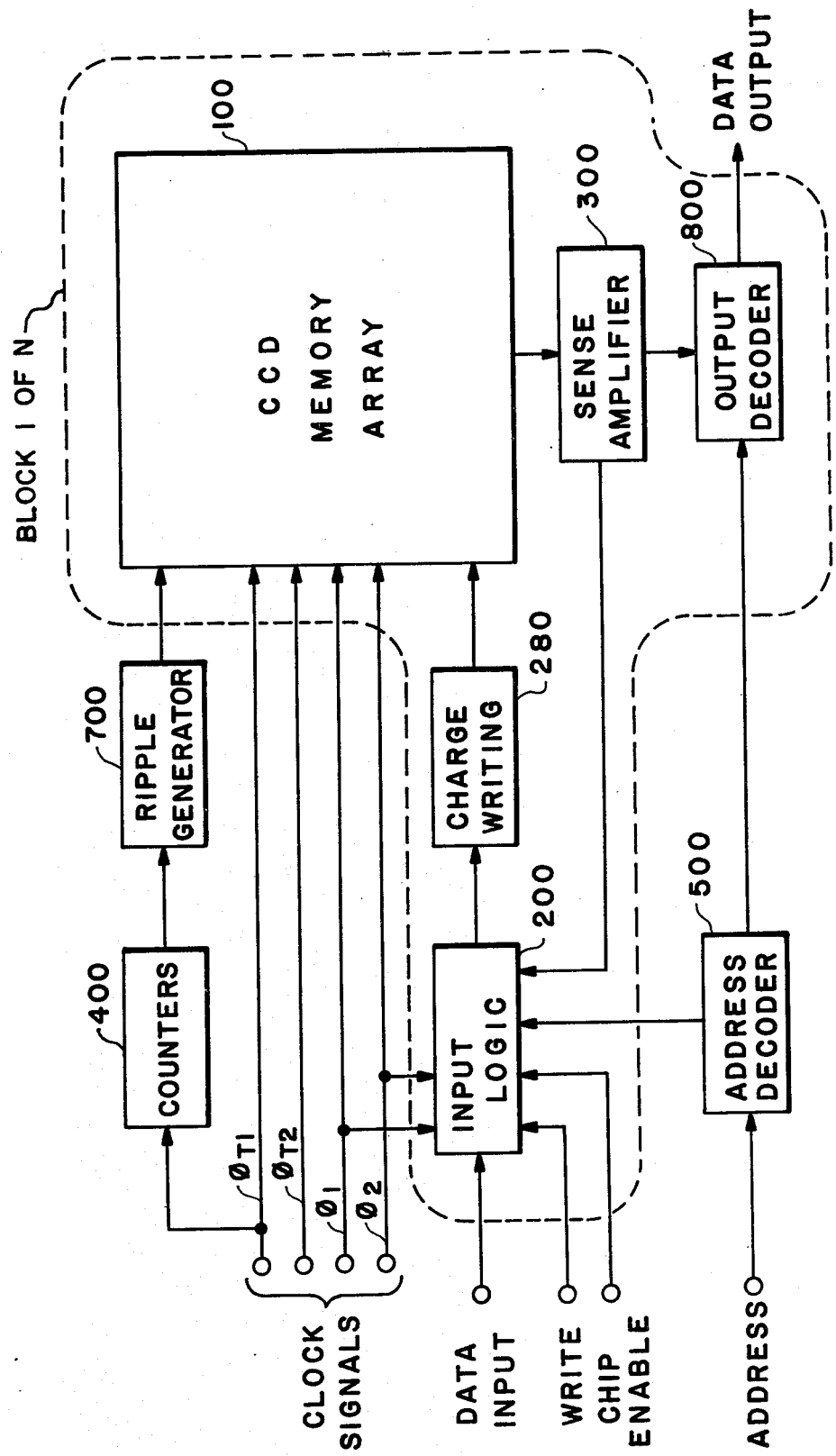
FIG. 1 is a system block diagram showing the arrangement of the components of one embodiment of the memory of this invention.

A system block diagram for one embodiment of the CCD memory is shown in FIG. 1. It comprises an array of CCD storage elements 100 whose packing density has been increased by interlacing. The CCD elements within array 100 are arranged in a serial-parallel-serial format. That is, data supplied from charge writing circuit 280 to array 100 are first transferred into a serial input shift register. In response to clock signals $\phi_1$ and $\phi_2$ driving the two phases of the input shift register, the data are shifted along the input shift register until the register is filled. For a two-phase register, data therefore will be present in every other element of the register. Then in response to a transfer signal $\phi_{T1}$, the data are shifted out of the input register into the first element of every other one of a group of parallel registers. After the data are shifted out of the serial input register, new data are shifted into the input shift register from circuit 280, in response to signals from input logic 200. These data are then transferred into the first element in the remaining vacant parallel registers. Then these new data and the data previously stored in each of the parallel shift registers are transferred to the second, or adjacent, element in each parallel shift register by clock signals supplied by ripple generator 700. Ripple generator 700 advances data in each of the parallel shift registers simultaneously, one element at a time by shifting an empty element from the bottom of each parallel register toward the top of each parallel register. In one embodiment of this invention each parallel register is divided into a plurality of smaller sections, each of which includes a blank potential well, to allow fewer ripple clock signals to be used to transfer the data along the parallel registers. Such an embodiment is shown in FIG. 13a.

When the parallel registers of array 100 are filled with data, a signal $\phi_{T2}$ may be applied to transfer data from the bottom element of every other parallel register into every other element of an output serial register. Data in this serial register are then supplied to sense amplifier 300 in response to clock signals $\phi_1$ and $\phi_2$. Once the output serial register is empty a new transfer from the parallel registers to the output serial register is made, and the data transferred to sense amplifier 300. Sense amplifier 300 detects and amplifies the signals supplied to it by array 100, and then supplies appropriate signals to output decoder 800.

In one embodiment of the CCD memory of this invention, CCD array 100 comprises 16 blocks of 4,096 storage elements each, providing a total storage of 65,536 bits. In this embodiment, address information is supplied to a decoder 500 to select which of the 16 blocks will receive data from the data input terminal and/or supply data to the data output terminal. The decoder 500 supplies appropriate signals to the input logic 200 which selects the desired one of the 16 blocks while allowing the data stored in the other 15 blocks to be recirculated. To enable the circuit shown in FIG. 1 to be used with conventional transistor transistor logic (hereinafter TTL) circuits, which are typically used to supply signals such as data input, write enable, chip enable, and address information and to receive the output from the CCD array, a series of level converters (not shown in FIG. 1) may be provided to interface between the TTL circuits used to supply such input signals and the MOS circuits used in one embodiment of this invention.

Logic Diagram—FIG. 2

A logic diagram for one embodiment of the CCD memory of this invention is depicted in FIG. 2. This logic diagram shows one embodiment of this invention in which the 16 individual memory blocks comprising array 100 are utilized and may be selectively operated to read only, read and write, read-modify-write and recirculate. These modes of operation of the CCD memory are explained below.

To read data from a given block of the CCD memory array 100, for example block 1, a logical one is presented to the write enable terminal, and therefore to AND gate 14. Assuming that the particular chip on which block 1 is addressed has been enabled by the presence of a logical one at the chip enable terminal, AND gate 14 will present a logical zero to AND gate 12 and to NAND gate 18. The zero at AND gate 12 prevents any signals at the data input terminal from influencing any block of the memory array. Also, AND gate 12 will supply a zero to AND gate 17. Because block 1 has been addressed, decoder 500 will cause signal $B_1$ to be a logical one signal, which is applied to AND gate 17 and NAND gate 18. None of the other blocks 2 through 16, will receive a logical one signal from decoder 500. The zero from AND gate 12 will cause AND gate 17 to apply a zero to NOR gate 20. The logical one of signal $B_1$ and the zero from gate 14 will cause NAND gate 18 to supply a logical one to AND gate 19 which will supply a logical zero or one to NOR gate 20 depending upon the state of line 11. NOR gate 20 will therefore supply a signal to block 1 of the CCD memory array 100 causing it to recirculate the data from its output. The logical one signal $B_1$ and the data from block 1 of the CCD memory will cause AND gate 22 to supply a signal to OR gate 800. Because the chip enable signal is a logical one, OR gate 800 will transmit the data to the data output terminal. All other inputs of OR gate 800 will be a logical zero because signals $B_2$ through $B_{16}$ will be logical zero state.

The data supplied to AND gate 22 will be fed back through line 11 through AND gate 19 and through NOR gate 20 to the input of block 1 to therefore cause a bit of data identical to the one supplied to gate 800 to be written into block 1 of the CCD memory. At the same time, and as a result of the signals being supplied by AND gate 14, data in the other 15 nonselected blocks of the CCD memory array 100 will be continuously recirculating.

A second mode of operation of the CCD memory depicted in FIG. 2 is the read-write mode. In this mode the write enable signal is made low while the chip enable signal is high. This disables the recirculation path 11 of the selected block. At the same time, however, new data supplied from the data input terminal to AND gate 12 will be written into the block from which data is being read. While this is occurring the other 15 blocks will recirculate the data stored in them as a result of $B_2$ through $B_{16}$ being zero.

Another mode of operation of the circuit depicted in FIG. 2 is the read-modify-write mode in which the chip enable signal is held high while the write enable signal switches from high to low. The write enable signal is held high except when modified data are presented to the data input terminal of a particular block, at which time the write enable signal is switched to a low state.

Yet another mode of operation of the device shown in FIG. 2 is the recirculate mode which occurs whenever the chip enable signal is a logical zero. A logical zero applied to the input of AND gate 14 results in a logical zero output signal from gate 14 which disables AND gate 12 and activates AND gates 18 . . . 28 associated with each of the 16 blocks. Thus data in all 16 blocks recirculate regardless of the input signals supplied by the write enable and the data input terminals. No data output signal will appear because OR gate 800 is a three-state OR gate in which the output signal is indeterminate except when the chip enable signal is high.

Write Enable Level Converter—FIG. 3

FIG. 3 is a detailed schematic of the write enable level converter circuit 920. The function of write enable level converter 920 is to convert the TTL level signal $\overline{WE}$ to an MOS signal and invert it. Circuit 920 also generates a signal $WE_1'$ for utilization by the data input level converter circuit 900. As previously explained, when output signal $We'$ of the write enable circuit 920 is logical one, it will allow signals supplied to the data input terminal to be written into the CCD memory; and when circuit 920 causes a logical zero signal to be supplied to terminal WE', information will be read from and recirculated in the CCD memory. Because most TTL/MOS-level converters charge and discharge a load capacitance, the equivalent of node A3, they are undesirably slow in operation. Usually in these converters, node A3, which is charged when $\phi_1$ is low and $\overline{WE}$ is low, is discharged through transistor 925 when $\overline{WE}$ goes high. The circuit shown in FIG. 3 operates faster than these prior art designs because whenever signal $\phi_1$ activates transistor 927, node A3 will be discharged to ground. This avoids delay when the $\overline{WE}$ signal is a logical one. At the time when node A3 is discharged by $\phi_1$, transistor 924 will be on if the chip is selected and off otherwise. In response to clock signal $\phi_1$ supplied to transistors 927 and 929, node A3 goes low through transistor 927 and node B3 goes high through transistor 929. The low at node A3 keeps transistor 930 off, allowing node B3 to be charged through transistor 929 to a high level. The high level at node B3 causes node C3 to discharge as a result of transistor 933 being on. Therefore, WE' unconditionally goes low as a result of transistor 935 being off and transistor 936 being on when $\phi_1$ is high.

Thus, if $\overline{WE}$ is high when signal $\phi_1$ goes to low level, there will be no change in the status of signal WE'. On the other hand, if $\phi_1$ goes low when $\overline{WE}$ is low, then node A3 will be charged, node B3 discharged and node C3 will begin charging. This charging bootstraps node D3 through capacitor 932 to drive transistor 934, allowing node C3 to reach $V_{DD}$ level, which drives transistor 935 to generate the WE' signal.

Converter circuit 920 will not be activated unless the particular chip on which it resides is activated. This is accomplished by introducing signal CE' into circuit 920 at several locations. If CE' is low, transistors 924 and 934 will never conduct and signal WE' will remain low. As has been explained, whenever signal WE' is low, the CCD memory will be recirculating, that is, identical information to that appearing at the output of CCD memory array 100 will be written into the input of array 100. When signal CE' is low, signal $\overline{CE}'$ will be high to keep node A3 grounded through transistor 928. Also, transistor 924 will be off since CE' is applied to its gate through transistor 922. Thus, no DC power is consumed by circuit 920 unless signal CE' is high. Circuit 920, in contrast to prior art circuits, utilizes only the charging of node A3 to produce a signal rather than charging and discharging it through, for example, transistors 924 and 925.

Data Input Level Converter—FIG. 4

A schematic of the data input level converter 900 is shown in FIG. 4. This converter 900 functions in a similar manner to the circuit 920 depicted in FIG. 3. The inverter comprising transistors 904, 905 and 906 will be activated by WE$_1$'. Transistor 905 in FIG. 4 performs the same function as transistors 927 and 928 in FIG. 3. If signal WE$_1$' is low, no data are supplied to the memory 100 from the data input terminal since $\overline{DI}'$ stays low when WE$_1$' is low regardless of the state of signal DI. Under this condition, no DC power is dissipated by circuit 900. On the other hand, the presence of an input signal DI and an input signal WE' will cause circuit 900 to supply a signal $\overline{DI}'$ to input logic circuit 200 in a manner similar to that described above in conjunction with FIG. 3.

Clock Delay Circuits—FIGS. 5a and 5b

A detailed schematic of the $\phi_1'$ clock generator circuit 600 is shown in FIG. 5a. Circuit 600 generates a delayed clock signal $\phi_1'$ at $V_{DD}$ level. This circuit is a dynamic circuit in which power is dissipated only when $\phi_1$ is high. Before $\phi_1$ goes high, nodes A5 and C5 are charged high while nodes B5, D5 and signal $\phi_1'$ of circuit 600 are discharged to ground. The rising edge of $\phi_1$ turns on transistors 612 and 614 and charges node E5 through transistor 617. This causes node A5 to discharge, allowing node B5 to charge, which in turn discharges node C5 through transistor 615. During this time delay caused by the propagation delay of signal $\phi_1$ to node C5, the bootstrap capacitor 618 is charged. As soon as node C5 is discharged, node D5 begins charging, bootstrapping node E5, which drives transistors 620 and 621, generating $\phi_1'$ signal. This generated signal goes to $V_{DD}$ level because node E5 is bootstrapped higher than $V_{DD}$.

When signal $\phi_1$ goes low, transistors 612 and 614 are turned off. Node E5 goes low, turning off transistors 620 and 621. Node A5 goes high and turns on transistors 613 and 616. Therefore, node B5 is discharged, and node C5 is charged, turning on transistors 619 and 622, and turning off signal $\phi_1'$. The advantage of bootstrap capacitor 618 connected to node D5 rather than the output node of the circuit in FIG. 5a is that node D5 has a very small capacitance and consequently is charged very quickly, enabling the circuit to operate at a high speed.

The $\phi_2'$ clock generator circuit 601 is shown in FIG. 5b. This circuit generates a signal $\phi_2'$, which is a delayed $\phi_2$ signal. The circuit shown in FIG. 5b functions in an analogous manner to that shown in FIG. 5a. Before $\phi_2$ goes high, G5 and I5 are grounded and transistor 632 is off. Nodes F5 and H5 are high and K5 is low. Transistor 640 is on, and therefore $\phi_2'$ will be low.

When signal $\phi_2$ goes high, node I5 will be charged to $V_{CC}$ and nodes G5 and J5 will go high as a result of transistors 624 and 635 being on. Node H5 will be discharged through transistor 633, and therefore node K5 will begin charging to bootstrap node J5 above $V_{DD}$ by virtue of capacitor 636. This will cause a signal $\phi_2'$ to be output from circuit 601.

When signal $\phi_2$ goes low, node F5 goes high. Node H5 is held low because node G5 is high and transistor 633 is conducting. The $\phi_2'$ signal is supplied to transistor 259 in circuit 200 to latch the information on node A8 onto node C8 when $\phi_2'$ is high. Additionally, the combination of transistors 625, 626 and 628 (with transistor 628 having the same resistance as the sum of transistors 250 and 254) with capacitor 627 causes node G5 to discharge at the same rate as transistors 250 and 254 in circuit 200. As soon as node G5 is discharged, node H5 is charged, and transistors 637 and 640 are turned on. Because transistor 640 is on, the output $\phi_2'$ of this circuit is discharged to ground.

Transistor 626 is used to discharge node I5 to ground when $\phi_1$ is high. Thus transistor 628 initially stays off when the $\phi_2$ clock signal goes high, and node G5 is charged mainly through transistor 624 to create enough delay to charge bootstrap capacitor 635.

Address Level Converter—FIG. 6

A detailed schematic of address level converter circuit 960 is shown in FIG. 6. The individual bit address level converter circuits 990, 991, 992, 993 in circuit 960 each receive a single four-bit address bit on terminals A0, A1, A2 and A3, respectively. These four single-bit address level converter circuits are identical, and the operation of one converter, circuit 990, is described below. Each converter circuit 990, 991, 992, 993 converts the TTL-level address signals to MOS level and generates a complementary signal. The address signals and their complements are supplied by converter 960 to an address decoder 500 associated with each block of CCD memory. Circuit 500 is shown in FIG. 8a and discussed below. The addresses supplied to the address level conductor 960 determine which of the 16 blocks, each of 4,096 bits, is selected for writing or reading operations.

Single-bit address level converter circuit 990 includes an input inverter 994, an asymmetrical flip-flop 995 and a push-pull driver 996. The input inverter circuit 994 is well known, receiving a TTL address as an input signal and, via transistors 963 and 965, generating an inverted signal. Similarly, push-pull driver 996 is a known design which generates output signals A0 and A0' from the input signals to transistors 976, 978, 979 and 980. Asymmetrical flip-flop 995 utilizes a clock signal $\phi_{RAC}$ generated in response to signals $\phi_1$ and $\phi_2$ by transistors 981 and 982 as shown. The $\phi_{RAC}$ clock signal is used to reset node B9 and node C9 to ground. This is accomplished by supplying the $\phi_{RAC}$ clock signal to transistors 966 and 977. When signal $\phi_1$ goes high, signal $\phi_{RAC}$ is discharged slowly through transistor 982 so that transistors 977 and 966 are still conducting while $\phi_1$ is already high. During this time capacitors 971 and 974 are charged. When $\phi_{RAC}$ is discharged transistors 966 and 977 are turned off. The flip-flop then begins building up charge across capacitor 971 or 974 to provide a bootstrap effect on whichever side is going to a high level.

Although a detailed schematic of the circuitry for only one single-bit address level converter 900, which receives input signal A0, is shown, identical circuits within blocks 991, 992 and 993 receive input address signals A1, A2 and A3, respectively. Each of these level converters is identical to circuit 990 and generates a pair of complementary signals—circuit 991 generates signals A1' and $\overline{A1}'$; circuit 992 generates signals A2' and $\overline{A2}'$, and circuit 993 generates signals A3' and $\overline{A3}'$.

Chip Enable Level Converter—FIG. 7

FIG. 7 is a detailed circuit schematic of chip enable level converter 540. This circuit is identical to circuit 990 shown in FIG. 6. Converter 540 generates signals CE' and $\overline{CE}'$ from TTL level signal CE in the same manner that circuit 990 generates A0' and $\overline{A0}'$ from A0.

Address Decoder and Decode Truth Table—FIGS. 8a and 8b

FIG. 8a shows a detailed circuit schematic of address decoder circuit 500. Each of the 16 blocks of CCD array 100 has associated with it an address decoder circuit 500. Circuit 500 accepts four selected signals from the eight generated by address level converter circuit 960. The choice of which four signals is supplied to address decoder 500 depends upon with which of the 16 blocks of memory the particular address decoder is associated. One suitable relationship is shown in the decode truth table in FIG. 8b.

The decoder shown in FIG. 8a is set whenever signal $\phi_1$ goes low. Whenever $\phi_1$ is high, output signal $B_n$ is unconditionally high for all of the 16 blocks of memory because transistor 534 in each of the 16 blocks is on.

When signal $\phi_1$ goes low, only one of the $B_1$ through $B_{16}$ signals will stay high because the other 15 $B_n$ signals are discharged through transistors 530, 531, 532 and 533, depending upon which one or more is on. At least one of these four transistors will be on in each of the 15 nonselected blocks because one of the address lines A0 to $\overline{A3}$ will be high. Only the selected block will have all four transistors turned off, thereby allowing signal $B_n$ to remain high. The $B_n$ signal also is supplied to output decoder 800 shown in FIG. 9 and to input logic circuit 200 shown in FIG. 12 to couple the proper block of CCD memory array to both the data input and data output terminals.

FIG. 8b is a decode truth table showing how the eight output signals from circuit 960, that is, A0' to $\overline{A3}'$, can be used to generate addresses for each of the 16 blocks of CCD memory. The four lines designated by an x in each row of the truth table are connected to that block number. In the manner described in conjunction with address decoder circuit 500, signals on the four lines connected to any one block will result in the presence or absence of a signal $B_n$ from address decoder 500.

An example will further clarify the decode truth table. Assume that block 10 is being addressed because the appropriate input signals A0, A1, A2 and A3 are supplied to circuit 960. Thus, address level converter 960 will generate high signals A0', $\overline{A1}'$, $\overline{A2}'$ and A3'. The other four outputs from circuit 960, that is, $\overline{A0}'$, A1', A2' and $\overline{A3}'$, will be low. At least one of the four high-level signals is supplied to an address decoder circuit 500 associated with each of the 15 nonselected blocks of the CCD memory, thereby preventing each of the 15 address decoders 500 from supplying a $B_n$ signal (where n is not 10). As is explained in conjunction with FIG. 12, the $B_n$ signal in each of the 15 nonselected blocks will cause the input logic 200 associated with that block to generate a signal to cause the data in that block to be recirculated. In the read-only mode, only the selected block of CCD memory array 100 will supply information to output buffer circuit 740 through output decoder 800 and then to the data output terminal. In the read and write mode, only one selected block of CCD memory array 100 will receive information from the data input terminal through level converter 900 and through input logic 200.

Output Decoder—FIG. 9

The output signals 0 and $\overline{0}$ from each sense amplifier circuit 300 discussed below are supplied to a respective output decoder circuit 800. A detailed circuit schematic of output decoder 800 appears in FIG. 9. Output decoder circuit 800 receives an input signal $B_n$ supplied by address decoder 500. As explained above, the $B_n$ signal determines which of the 16 output decoders, each associated with a single block of CCD memory array 100, is selected. As explained in conjunction with sense amplifier circuit 300 and in conjunction with address decoder circuit 500, output signals O, $\overline{O}$ and $B_n$ are unconditionally high whenever signal $\phi_1$ is high. This allows nodes A12, B12 and C12 to be discharged through transistors 861, 862, 864, 865 and 866 because all these transistors are turned on at that time. When signal $\phi_1$ goes low, one of signals O and $\overline{O}$ will be discharged while the other will remain high. Assuming signal O is high, $\overline{O}$ is low, and signal $B_n$ is high for this particular block, when signal $\phi_2$ is supplied to the block, transistors 864, 862 and 866 will be on and node B12 will be charged high because transistors 861 and 865 are off. As soon as node B12 goes high, transistor 860 will begin conducting while transistor 867 will remain off. If node B12 is high, then terminal D will be discharged. Thus, only one of transistors 860 and 867 will be conducting, and the other will remain off causing one of signals D and $\overline{D}$ to stay high while the other will go low. These signals supplied to output buffer circuit 740 cause an output signal at the data output terminal.

In the other 15 nonselected blocks, signal $B_n$ will be low, and the equivalent of transistor 864 in each of the 15 blocks will not be conducting, causing nodes B12 and C12 of each of these 15 blocks to remain low. Thus, the corresponding transistors 860 and 867 in the 15 unselected blocks will be off and will not affect the state of signal D or $\overline{D}$, which will be generated only by the on and off condition of transistors 860 and 867 in the selected block.

Clock Generator—FIG. 10

A detailed schematic of clock generator circuit 580 is shown in FIG. 10. The purpose of circuit 580 is to generate signals $\phi_{TRS'}$, $\phi_{TRS}$ and $\phi_{2CE}$. Signals $\phi_{TRS}$ and $\phi_{TRS'}$ are used to allow the output level converter 740 shown in FIG. 11 to be in a high-impedance state. This allows the output from the data output terminal to remain "neutral" when the chip on which the entire memory is fabricated is not selected by the system in which it is being utilized.

Clock generator 580 of FIG. 10 includes three similar circuits: 581, 582 and 583. Circuit 581 generates clock signal $\phi_{2CE}$. If the chip in which circuit 581 is formed is selected, then signal CE' will be high, allowing node A16 to be charged whenever signal $\phi_1$ is high, thereby keeping signal $\phi_{2CE}$ low white clock $\phi_2$ is still low. This also charges capacitor 576. As explained in conjunction with converter circuit 540, when signal CE' is high, signal $\overline{CE'}$ is low, keeping transistors 577 and 574 off. When signal $\phi_1$ goes low, transistor 578 is turned off and node A16 floats. Transistors 577 and 574 are off because $\overline{CE'}$ is low. Then, when signal $\phi_2$ goes high, $\phi_{2CE}$ goes high, bootstrapping node A16 through capacitor 576 to supply a signal $\phi_{2CE}$, which is very nearly in synchronization with signal $\phi_2$.

If the chip is not selected, then node A16 is discharged because signal CE' is zero and $\overline{CE'}$ is high. Thus, transistors 574 and 577 maintain signal $\phi_{2CE}$ at a low level. The on state of transistor 577 prevents coupling between signal $\phi_2$ and node A16 by keeping node A16 low so no DC current flows through transistors 575 and 574.

Signal $\phi_{TRS}$ is generated by circuit 582. When signal $\overline{CE'}$ is high, node B16 will be charged whenever signal $\phi_1$ is high, also charging capacitor 572. Because signal $\phi_1$ is high, also transistor 570 will be off. When $\phi_1$ goes low, transistor 573 is turned off to allow node B16 to float. Transistors 568 and 570 are off because CE' and $\phi_{2CE}$ signals are low. Then, when signal $\phi_2$ goes high, $\phi_{2\overline{CE}}$ goes high, bootstrapping node B16 through capacitor 572 to supply signal $\phi_{2\overline{CE}}$ which turns on transistor 574 to generate signal $\phi_{TRS}$. When $\phi_2$ goes low, $\phi_{2\overline{CE}}$ also goes low, but $\phi_{TRS}$ signal stays high. During any subsequent cycle when signal $\phi_{2CE}$ is generated, $\phi_{TRS}$ is discharged to ground through transistor 568.

Circuit 583, which generates $\phi_{TRS'}$, functions in the same manner as circuit 301 shown in FIG. 14a and discussed below. Circuit 583 generates signal $\phi_{TRS'}$ from signals $\phi_1$ and $\phi_{2CE}$ while circuit 301 generates signal $\phi_R$ from $\phi_1$ and $\phi_2$.

Output Buffer—FIG. 11

A detailed schematic of output buffer circuit 740 is shown in FIG. 11. In addition to the signals generated by clock generator 580 shown in FIG. 10, output buffer circuit 740 also receives signals D and $\overline{D}$. Although connected to all 16 blocks, the state of D and $\overline{D}$ will be determined only by the output decoder 800 associated with the selected block. Output buffer circuit 740 includes two identical circuits 775 and 776, circuit 776 being associated with signal D and circuit 775 with signal $\overline{D}$. Only circuit 775 will be discussed herein because circuit 776 functions in a complementary manner. Circuit 775 controls transistor 743, and circuit 776 controls transistor 742. Because D and $\overline{D}$ are always complementary signals, one and only one of transistors 742 and 743 will be on. Thus, the data output signal either will be high or low—high if transistor 742 is on and low otherwise. The line on which signal $\overline{D}$ is presented is precharged by transistor 771. Transistors 769 and 770 insure that signal $\overline{D}$ will be charged to a voltage which is independent of high level of $\phi_1$ clock and is equal to $V_{DD} - 2V_T$. As signal $\overline{D}$ is high when signal $\phi_2$ goes high, capacitor 767 will be charged as the result of clock signal $\phi_{2CE}$, which is applied to node C15 through transistor 768. Assuming that $\overline{D}$ goes low as a result of transistor 867 of FIG. 9 being turned on, nodes A15 and D15 are charged high. The charge on node D15 is fed back to node B15, which is coupled to node A15 by transistor 765, thereby raising the potential of node A15. The increased potential at node A15 also increases the potential of node C15. This causes transistor 762 to conduct more, raising the potential of node D15 higher. This positive feedback causes nodes B15 and A15 to go higher than $V_{DD}$ level and node D15 to go to $V_{DD}$ level. Transistor 760 allows the information at D15 to be transferred to E15 to control transistor 743.

When signal $\phi_{2CE}$ goes low (which is at approximately the same time that signal $\phi_2$ goes low), node C15 is discharged. As soon as node C15 is discharged, transistor 760 is turned off and the information is latched at node E15. The charging and discharging of node E15 turns transistor 743 on and off, which, in conjunction with transistor 742, regulates the output signal presented at the data output terminal.

Figure 12:
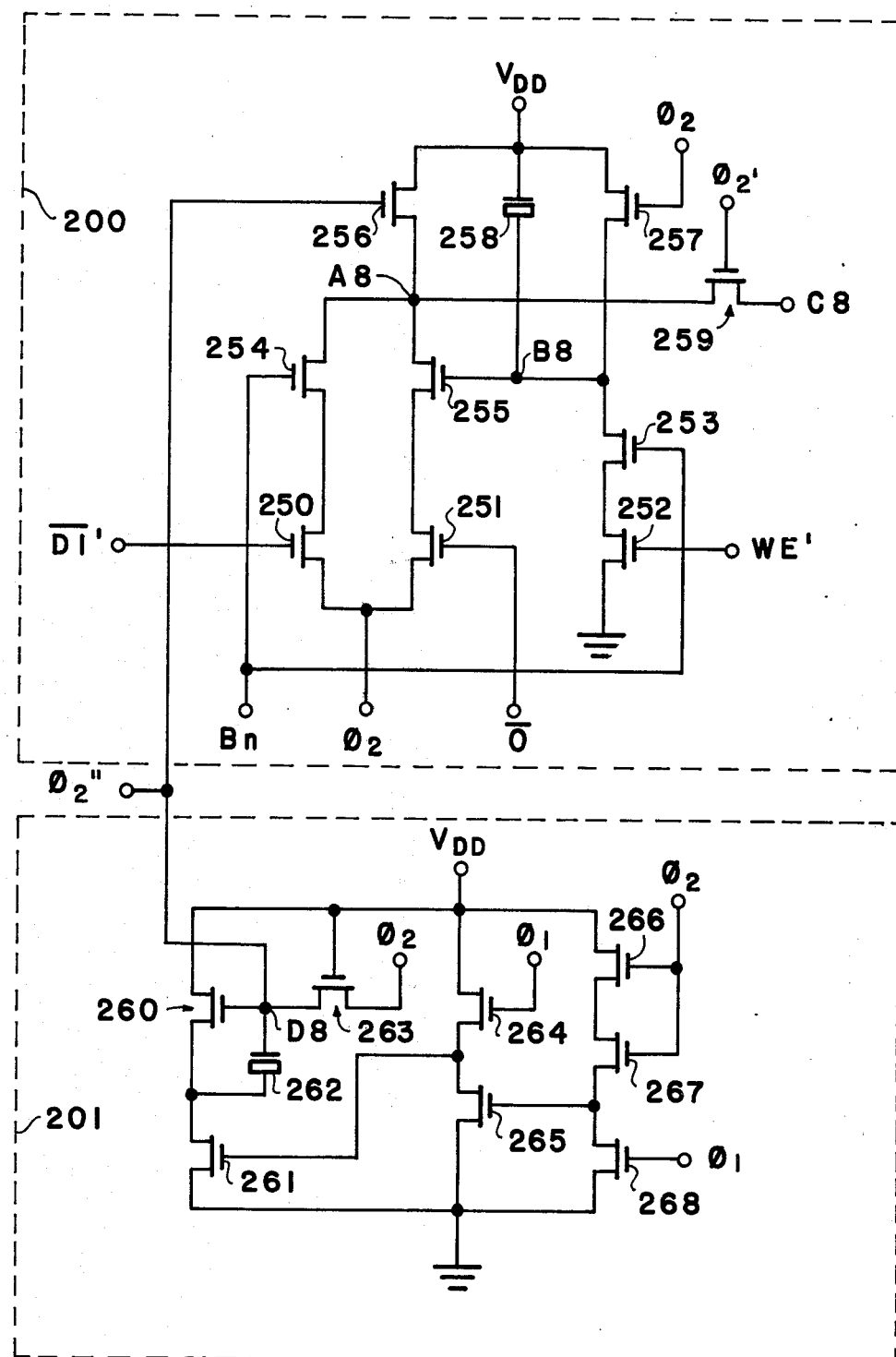
FIG. 12 is a schematic of a particular input logic circuit.

Input Logic—FIG. 12

A detailed schematic of input logic circuit 200 is shown in FIG. 12. Each block of array 100 has a separate identical logic circuit 200. When the particular input logic 200 associated with a block of CCD memory is selected and the device is in the write mode ($\overline{WE}$ low), input logic 200 causes data from the data input terminal to be written into CCD memory array 100. If the particular block is not selected or the device is in the read or recirculate mode, then input logic 200 writes data from the output of the CCD memory block back to the input to thereby recirculate or refresh the information stored in memory 100.

Data from the data input terminal is supplied to the gate of transistor 250 in the form of signal $\overline{DI'}$. Input logic circuit 200 also receives a signal $B_n$, which is supplied to the gate of transistors 254 and 253, from address decoder 500. Additionally, a signal WE' is supplied to the gate of transistor 252. If data are to be written into the CCD memory from the data input terminal in the manner previously explained, then signal WE' will be high. Thus, when signal $\phi_2$ is high, node B8 of the selected block will be low because signal $B_n$ of the selected block is high. During this time, node A8 is charged to a high level through transistor 256. The low level on node B8 turns off transistor 255, making the condition of node A8 independent of signal $\overline{O}$ that is supplied to transistor 251. Because transistor 254 is on, the condition of node A8 will be determined by the presence or absence of signals $\overline{DI'}$. Thus, when signal $\phi_2$ goes low, node A8 stays high or discharges to a low level depending upon signal $\overline{DI'}$. If the input data bit is zero, then $\overline{DI'}$ will be high and node A8 will be discharged. If the input data bit is one, the $\overline{DI'}$ will be low and node A8 will stay charged. When $\phi_2'$ is high, the information at node A8 will be transferred to node C8. When signal $\phi_2'$ goes low, the information on node C8 is latched until signal $\phi_2'$ goes high again. The signal on node C8 is supplied to the input of charge writing circuit 280 of CCD memory array 100 where the information is written into array 100 in a manner hereinafter described.

If data are to be read from the selected block of CCD array 100, then $\overline{WE'}$ will be high, making WE' low; and $\overline{DI'}$ will be low because it is activated by WE'. Therefore, transistor 250 will be off. Because WE' is low, node B8 will be high. The condition of node A8 after $\phi_2$ goes low will depend upon the state of signal $\overline{O}$. If $\overline{O}$ is high, then node A8 will be discharged; and if $\overline{O}$ is low, then node A8 will remain charged. Signal $\overline{O}$ is generated by sense amplifier 300, and if charge is sensed, $\overline{O}$ is low, while if charge is not sensed, $\overline{O}$ is high. Thus, the state of signal $\overline{O}$ causes node C8 to stay charged or to be discharged, causing information identical to that supplied from the selected block of CCD memory array 100 to be rewritten into the same block of memory array 100.

The other 15 blocks of memory array 100 will be recirculating while information is being read from or written into the addressed block. In the other 15 blocks, signal $B_n$ is low, turning off transistors 254 and 253, thereby making the condition of node A8 independent of signal $\overline{DI}$. In these blocks, node A8 will stay charged or be discharged depending upon the condition of signal $\overline{O}$ because node B8 is high and transistor 255 is conducting. Thus, as described in conjunction with reading of information, the 15 non-selected blocks will be recirculating data automatically. Therefore, only the single addressed block can receive data from the input terminal.

Circuit 201 in FIG. 12 generates a clock signal $\phi_2''$, which is used to control transistor 256. Transistor 256 charges node A8 whenever signal $\phi_2$ is high. The clock circuit comprised on transistors 260 through 268 and including capacitor 262 operates in a fashion similar to that used by the clock circuits 600 and 601 shown in FIGS. 5a and 5b. The output $\phi_2''$ is generated from a bootstrapped node D8 so that the high level of $\phi_2''$ is higher than $V_{DD}$ level.

CCD Memory Array—FIGS. 13a–13d

One of the 16 blocks of the CCD memory array 100 is shown in FIG. 13a. Although a block may be of arbitrary size, in one embodiment a block is able to store 4,096 bits. Each block of CCD memory array 100 is arranged as a serial-parallel-serial memory and includes interlacing and ripple clocking of the parallel shift registers to increase the bit storage density. A parallel shift register of the block shown includes nine groups of eight electrodes, each group being capable of storing seven bits of information. A serial register includes 32 electrodes associated with each of the 100 $_1$ and $\phi_2$ clock signals for a total of 64 electrodes. In operation, data are supplied to a serial input shift register which is driven by clock signals $\phi_1$ and $\phi_2$. The data are stepped across the serial shift register in a conventional two-phase CCD manner. As soon as the serial shift register is filled with one bit stored beneath every other electrode, a signal $\phi_{T1}$ is supplied to allow these bits of information, represented by charge packets stored beneath the serial register electrodes, to be transferred into the input electrode of every other parallel shift register. Then, additional data are stepped into the serial shift register by application of signals $\phi_1$ and $\phi_2$. Once the data are stored under every other electrode in the input serial shift register, this time residing under electrodes not used in the previous transfer, signal $\phi_1$ is again supplied to allow the charges under the electrodes to be transferred into the input elements of the remaining unused alternate parallel shift registers. Once this is complete, ripple clock signals R1, R2 . . . R8 are applied to the groups of elements of the parallel shift registers to transfer the data along the parallel registers. When the input electrode of each of the parallel shift registers is vacant, new data from the input serial shift register are transferred and the process is repeated. The application of the ripple clock signals results in the rippling movement of 64 bits of data in the parallel shift registers. That is, a blank potential well is moved backward in each group of eight electrodes of the parallel shift registers, thereby transferring the data forward one electrode for each eight electrodes that the blank moves backward. Signal $\phi_{T2}$ is applied to cause a transfer of the data from the output electrode of every other one of the 64 parallel shift registers to be transferred into corresponding alternating electrodes of the output serial shift register. These data are then stepped out of the output serial register by the application of signals $\phi_1$ and $\phi_2$ and supplied to sense amplifier 300. As soon as the output serial register is vacant, another transfer is initiated, and further data are supplied to sense amplifier 300.

To perform the transfer from alternate parallel registers to the output serial register, applicants have utilized a new technique which is depicted schematically in FIGS. 13b and 13c. According to this technique, an additional gate 112, to which signal $V_{CC}$ is applied, is inserted between the endmost electrode 110 of a parallel register and transfer gate electrode 115, which separates the parallel register from the serial output register. Gate 120 is one electrode of the serial output register. Signal R6 is applied to gate 110 while signals $\phi_1$ and $\phi_2$ are alternately applied to electrode 120. The barrier regions 111 and 117 prevent charge from being transferred between the parallel register and the serial output register except when signal $\phi_{T2}$ is high. A constant signal $V_{CC}$ is applied to electrode 112 to provide an intermediate voltage level between the high level of $\phi_1$ (and $\phi_2$) and the low level of R6.

The manner in which charge is transferred from electrode 110 to electrode 120 is shown in FIGS. 13b and 13c. In FIG. 13b, assume charge has been transferred to beneath electrode 110 by suitably increasing the potential on electrode 110 and is to be transferred to electrode 120 (the serial output shift register). When the potential of signal R6 is again lowered, charge is transferred from electrode 110 to beneath electrode 112. (See FIG. 13b.) The low potential signal $\phi_{T2}$ is then raised to cause charge to flow beneath every other electrode 120, which are at a high potential as a result of signal $\phi_1$. (See FIG. 13c.) No charge is transferred beneath the electrodes to which signal $\phi_2$ is applied because these electrodes are held at a low potential by signal $\phi_2$. The $\phi_{T2}$ signal is then lowered and the $\phi_1$ and $\phi_2$ signals applied to the serial register to shift the charges out of the serial register and to sense amplifier 300. The entire process is then repeated but with $\phi_2$ high and $\phi_1$ low to shift a new set of charges into alternating elements of the serial output register.

Figure 13D:
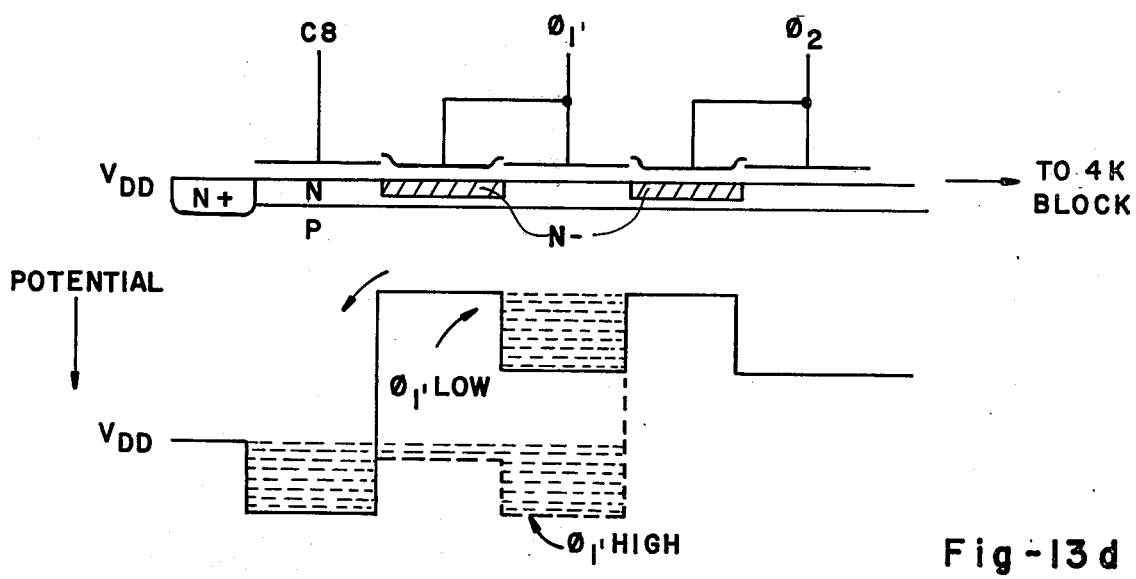
FIG. 13d is a potential diagram of charge writing circuit 280.

Circuit 280 shown in FIG. 13a is shown in expanded form in FIG. 13d with a potential diagram to illustrate its operation. With clock signal $\phi_1'$ at a high level, charge injected at terminal C8 will be present beneath the electrode connected to terminal C8 and will be present beneath the electrode to which signal $\phi_1'$ is connected. When signal $\phi_1'$ then switches to a low level, the charge beneath the $\phi_1'$ electrode will be separated from that beneath the electrode connected to terminal C8. Then, by continued pulsing of $\phi_1'$ and $\phi_2$, the charge will be transferred into the block of CCD memory.

Sense Amplifier—FIGS. 14a–14d

Figure 14B:
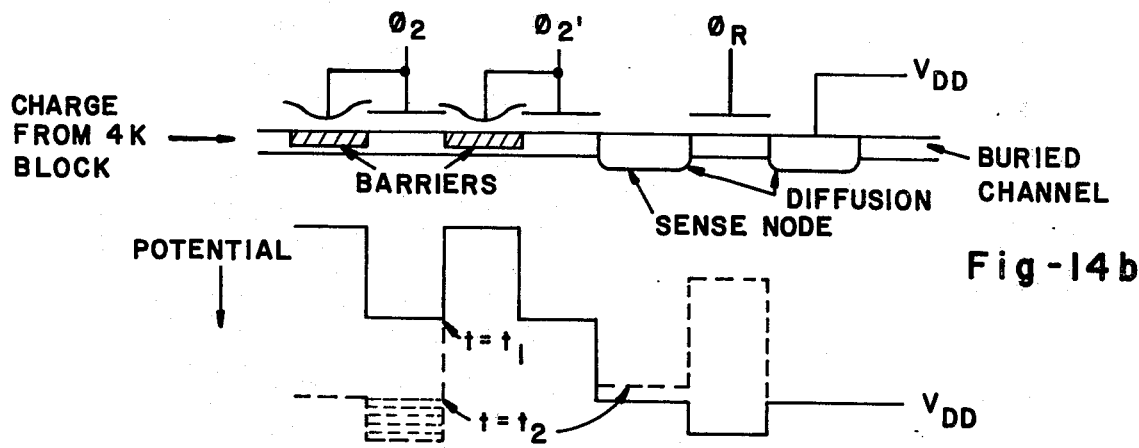

A detailed circuit schematic of sense amplifier 300 is shown in FIG. 14a. Certain types of sense amplifiers for CCD arrays are well known. See e.g. FIG. 6 of U.S. Pat. No. 4,024,512, entitled "Line-Addressable Random-Access Memory" issued to Amelio and Gunsagar, and assigned to Fairchild. See also U.S. Pat. No. 4,003,034 entitled "Sense Amplifier Circuit for a Random-Access Memory" issued to Au, and also assigned to Fairchild. The basic flip-flop of sense amplifier 300 is comprised of transistors 321, 323, 324, 326 and 327. Devices 320 and 322 are reset transistors for the sense node SN and the reference node RN, respectively. Sense amplifier 300 has a better dynamic range than previously designed sense amplifiers. This may be understood by reference to FIGS. 14b and 14c. In previous designs the CCD output gate is held at an intermediate DC voltage VOG. This gate prevents reverse charge flow from $V_{DD}$ to the last CCD storage gate when the sense node is reset to $V_R$. Charge is transferred to the sense node when $\phi_2$ goes low. For complete charge transfer without a barrier, the potential $V_2$ is greater than $V_1$. The dynamic range of the sense amplifier in this case is then given by ($V_R - V_2$), which is the maximum permissible swing of the sense node before charge flows onto the output gate.

Figure 14C:
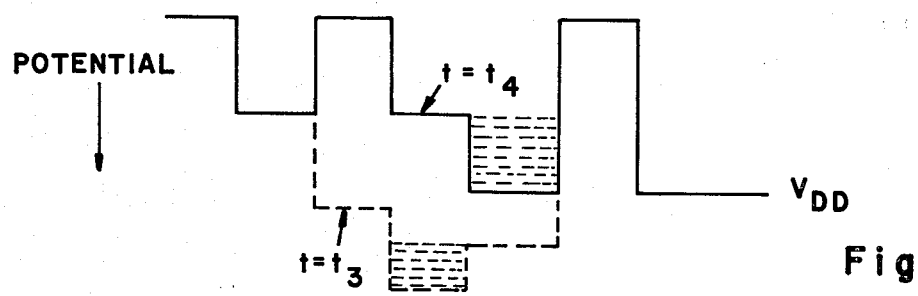
Figure 14D:
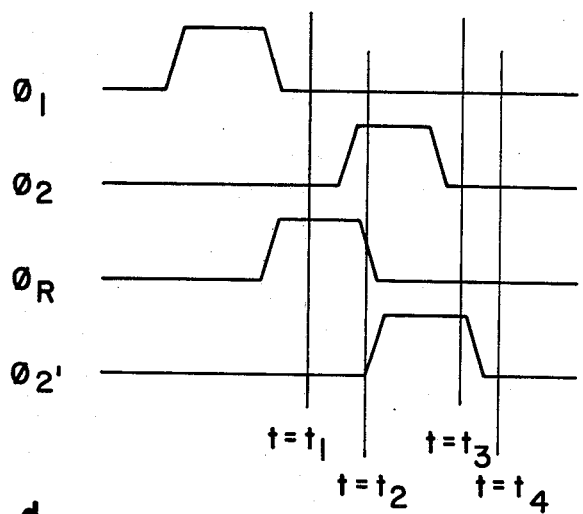
FIG. 14d is a timing diagram showing the relationship of signals applied to create the potentials shown in FIGS. 14b and 14c.

In one embodiment of this invention, shown in FIGS. 14b–14d, the sense node is first reset to $V_{DD}$. Then charge data are transferred to the sense node, and finally this charge is detected by means of a comparator. The sense node is reset to $V_{DD}$ by an internally generated clock signal, $\phi_R$. The $\phi_R$ clock comes during the underlap of $\phi_1$ going low and $\phi_2$ going high. Signal charge from the last $\phi_2$ gate is transferred to the CCD output gate by the falling edge of $\phi_2$ clock. The CCD output gate is driven by the internally generated, delayed $\phi_2$ clock ($\phi_2'$). The timing of the $\phi_R$ and $\phi_2'$ clocks are shown in FIG. 14d. The signal charge under the $\phi_2'$ gate is transferred to the sense node (signal node) by the falling edge of the $\phi_2'$ clock. Simultaneously a reference charge is transferred to the other sense node (reference node) of the comparator. The CCD signal and reference charge produce different voltage swings on the two sense nodes. The charge difference is compared and amplified during $\phi_1$ clock high time when the comparator is activated.

The dynamic range in this case is given by $V_R - V_1$. As the potential $V_2$ is greater than $V_1$, the dynamic range of the sense amplifier shown in FIG. 14a is greater than the previous designs for a given set of process parameters.

Sense amplifier circuit 300 shown in FIG. 14a includes two output buffers which are shown to the right of node C11 and to the left of node B11, and which supply signals O and $\overline{O}$ respectively. These output buffers comprise a storage area which holds the output signal from the sense amplifier flip-flop temporarily until a valid $B_n$ signal is supplied.

The condition of nodes B11 and C11, that is, whether charged or not, is dependent upon the data presented to the reference node RN and to the sense node SN. For example, node C11 will be low if node SN receives a charge greater than node RN. Assuming this to be the case, transistor 323 will be less conductive than transistor 324; and when signal $\phi_1$ is high, node B11 will receive less charge and node C11 more charge. Therefore, C11 will cause transistor 326 to start conducting and hold node B11 at a lower voltage. If node SN does not receive any charge, then transistor 323 will be more conductive, causing node B11 to be high and node C11 to be low. Transistor 334 avoids any pattern sensitivity in the function of the device by resetting node D11 to zero charge each time signal $\phi_2$ is high. In this manner, the sense amplifier circuit 300 always starts with identical conditions and identical capacitance on both sides of the output buffer. This prevents any leftover charge from a previous cycle present at node D11 and its corresponding node on the left-hand side of FIG. 11 from being reflected to nodes B11 and C11 to cause errors in operation of the sense amplifier circuit.

Because the right-hand and left-hand buffers operate in the same manner, only the right-hand buffer is described below. When signal $\phi_2$ is high, transistor 330 allows A11 to become charged. When $\phi_1$ goes high, the voltage at node A11 is boosted by the capacitive coupling of capacitor 331. The voltage on node D11 increases due to the charging of capacitor 335 through the transfer device 332. When signal $\phi_1$ is high, either node B11 or C11 will go high. If C11 goes high, nodes D11 and A11 are discharged through 329. If C11 stays low, then node voltages A11 and D11 stay high. Terminal O is charged through transistors 336 and 337 as a result of the presence of signal $\phi_1$. When $\phi_1$ goes low, O is discharged if D11 is high but remains charged if D11 is low.

The group of transistors 347–349 and 351–353 and capacitor 350 shown in the upper left-hand corner of FIG. 14 is a reset clock. The function of these transistors is to generate a signal $\phi R$ which is supplied to transistors 320 and 322 to reset sense node SN and reference node RN to the same potential. This circuit generates a reset signal whenever signal $\phi_1$ goes low.

When signal $\phi_1$ is high, transistor 353 allows capacitor 350 to be charged. At the same time, transistor 347 keeps signal $\phi R$ low. Then, when signal $\phi_1$ goes low, signal $\phi_1'$ goes low, and the source of transistor 353 together with the gate of transistors 351 and 352 begin floating, causing signal $\phi R$ to go high. Signal $\phi R$ is bootstrapped to level $V_{DD}$.

Applicants have discovered that a barrier glitch is created in a CCD structure whenever the channel width is narrowed within a CCD shift register in the direction of charge flow. Due to this effect (herein referred to as the Varshney effect), some charge is trapped in the input serial register during the transfer of charge from serial shift register to the parallel shift registers. The trapped charge is eventually cleared by the $V_{DD}$ sink at the end of the serial register. The amount of charge trapped due to the Varshney effect is a function of process parameters which may vary over a range during the fabrication of such a device. Applicants have discovered a technique to generate a reference charge signal which is compensated for the Varshney effect, and therefore improves the performance of the sense amplifier.

Figure 14E:
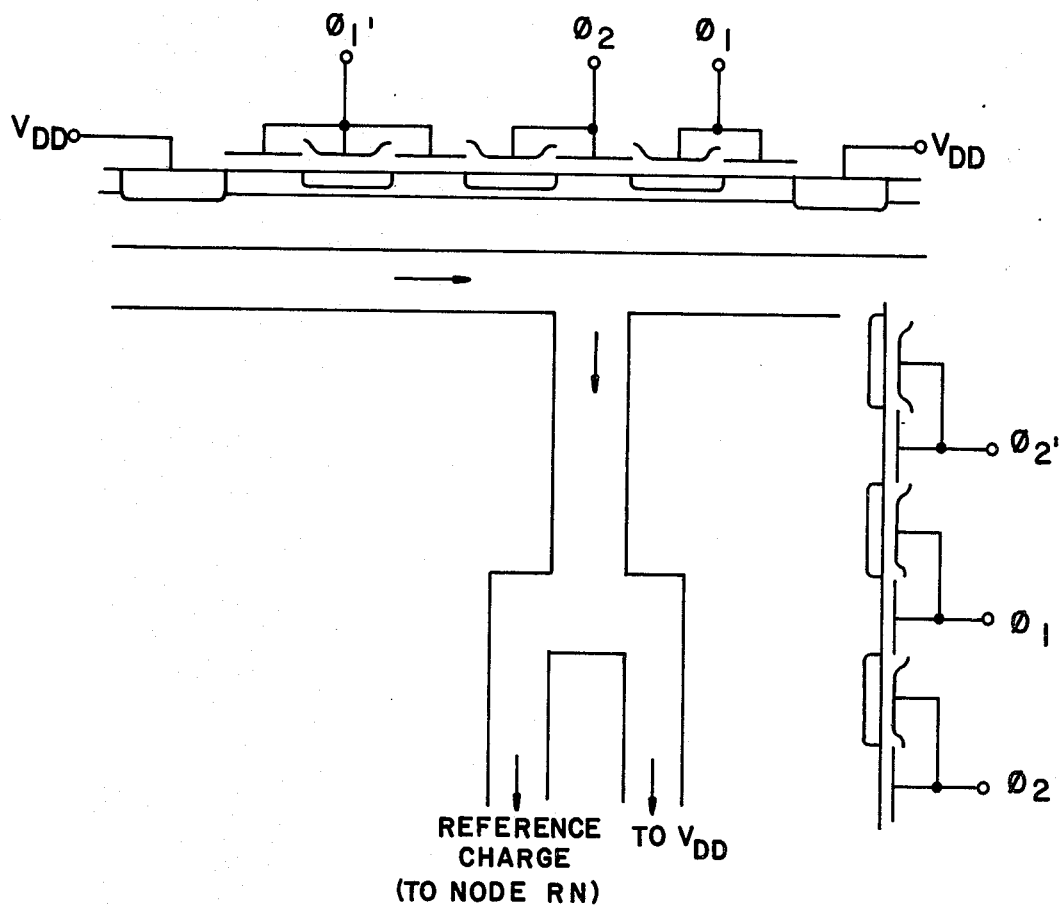

According to this technique, a dedicated eight-bit shift register with a charge splitter is used for each block of the CCD memory to generate the reference charge. The Varshney effect compensated reference charge generator is shown in FIG. 14e where the reference charge is forced to turn an identical corner as the signal charge turns in each block. In this technique, the internally generated $\phi_2'$ (delayed $\phi_2$) clock is used as the transfer clock rather than signal $\phi_{T1}$. The charge is transferred from the $\phi_2$ gate in the serial register to the $\phi_2'$ gate. An alternate approach is possible in which the $\phi_1'$ ($\phi_1$ delayed) clock may be used as the transfer gate.

Ripple Generator—FIGS. 15 and 16a–16d

The signals supplied to the electrodes of the parallel shift registers to cause the data stored thereunder to be shifted toward the serial output shift registers are generated by the circuits shown in FIGS. 16a, 16b, 16c and 16d. A simplified block diagram of these circuits is shown in FIG. 15.

As shown in FIG. 15, clock signals $\phi_1$, $\phi_2$ and $\phi_{T1}$ are supplied to a first divide-by-eight circuit 400. Circuit 400 produces in response thereto signals F1, $\overline{F1}$, F2 ... $\overline{F4}$, which are supplied to auxiliary clock generator circuit 480 and to ripple driver 700. The manner in which the F signals are generated will be explained in conjunction with FIG. 16a, while the relationship of the signals is shown in FIGS. 24a to 24 oo.

Using the F signals from circuit 400, auxiliary clock generator circuit 480 generates signals CO1, CO2 and CO3, which are supplied to a second divide-by-eight circuit 470. Circuit 470 is explained in conjunction with FIG. 16b, while the relationship of the CO signals is shown in FIGS. 24p–24r.

Divider 470, using the signals from circuit 480 and the clock signals $\phi_1$, $\phi_2$ and $\phi_{T1}$, generates signals S1, $\overline{S1}$, S2 ... $\overline{S4}$, which are supplied to ripple driver 700. The operation of circuit 470 is discussed in conjunction with FIG. 16c, while the relationship of signals S1 ... $\overline{S4}$ are shown in FIGS. 24t–24gg.

In addition to the S signals from the second divide-by-eight counter 470, clock signals from circuit 400 and circuit 480 and signals $\phi_1$ and $\phi_2$ are supplied to ripple driver 700. In response to these signals circuit 700 generates signals R1 to R8. These signals are shown in FIGS. 24hh–24oo.

FIG. 16a shows the first divide-by-eight circuit 400 using a well known, two-phase, four-bit ring counter. It is driven by clocks $\phi_1$ and $\phi_2$. Clock $\phi_{T1}$ is used to initialize the counter. The output of circuit 400, appearing between transistors 418 and 419, is fed back to the input of the circuit at the gate of transistor 407. Although only one stage 420 of the four-bit shift register is shown in detail, circuit 400 includes four identical stages designated 420, 421, 422 and 423. Circuit 400 generates signals F1 through $\overline{F4}$, which are supplied to auxiliary clock generator circuit 480 comprised of circuits 425, 426 and 427 shown in FIG. 16b. These circuits are also well known circuits and generate three auxiliary clocks CO1, CO2 and CO3. These clocks are used as input signals to another divide-by-eight circuit 470, which uses three-phase, four-bit shift registers 440, 441, 442 and 443 shown in FIG. 16c. These shift registers generate signals S1 through $\overline{S4}$, which are supplied to the ripple driver shown in FIG. 16d.

A detailed schematic of ripple driver 700, comprised of eight driving circuits 730 through 737, is shown in FIG. 16d. The function of the ripple driver 700 is to provide ripple clocks R1 through R8 to memory array 100 to transfer information along the parallel shift registers. Each of the ripple driving circuits 730 through 737 generates a signal every eight cycles of the main clocks $\phi_1$ and $\phi_2$ with each driving circuit being eight cycles behind the preceding circuit, as a result of the signals supplied to the various driving circuits from circuits 400, 470 and 480. Circuits 730 through 737 receive signals from circuit 400 and circuit 480, but different signals from circuit 470 determine which one of the eight ripple driving circuits 730–737 is activated.

The operation of the ripple generator depicted in FIGS. 16a–16d may be more clearly understood by reference to FIG. 24, which depicts the interrelationship of ripple signals R1 through R8 together with other intermediate signals, e.g., the F and S signals used in generating R1 to R8.

The operation of circuit 730, which receives signals $S_1$ and $S_4$ from 470, is explained herein. The rest of circuits 731 through 737 operate identically. As shown in FIG. 24v and ee, signals $S_1$ and $S_4$ stay low for 32 cycles and high for 32 cycles of the main clocks $\phi_1$ and $\phi_2$, but they are skewed by eight cycles. Thus, in an interval of 64 cycles of the main clocks $\phi_1$ and $\phi_2$, both signals are low for eight cycles while during the rest of the 64 cycles at least one (or both) is high. These two signals are fed to transistors 713 and 714, which form a NOR gate. The load of this NOR gate consists of a transistor 712 in series with the two parallel transistors 710 and 711. Transistor 712 is driven by CO1 clock, and transistors 710 and 711 are driven by $\phi_1$ and $\phi_2$ clocks. This combination minimizes the power dissipation in this NOR gate. Node A7 is charged when both $S_1$ and $S_4$ signals are low. A high level on node A7 turns on transistors 720, 724, 723 and 718 and charges bootstrap capacitor 719. As soon as signal F2 from circuit 400 goes high, transistor 717 turns on, discharging node C7, which in turn switches off transistor 721. At this time, the potential of node B7 starts rising, which bootstraps node E7 through capacitor 719, raising its potential higher than $V_{DD}$. Thus ripple output R1 goes to $V_{DD}$. When CO3 goes high, transistors 715, 716 and 722 turn on. This discharges node A7 and charges nodes C7 and D7 to discharge the ripple clock signal to low level.

Clock Symbols—FIG. 17

FIG. 17 is a table of symbols utilized in FIGS. 19 through 24. FIG. 17 includes the applicable minimum or maximum time for the various parameters shown in FIGS. 19 through 24, when these signals are generated using the circuits shown in FIGS. 3 through 16.

Clock Signal Timing—FIGS. 18 and 19

The interrelationship of the four basic system clocks, $\phi_1$, $\phi_2$, $\phi_{T1}$ and $\phi_{T2}$, is shown in FIG. 18. FIGS. 18a, b, c and d show that the $\phi_2$ clock is interspersed with the $\phi_1$ clock signal so that the signals alternate on a one-to-one basis. The transfer clock $\phi_{T1}$, which causes the charges stored beneath alternating electrodes of the input series shift register to be transferred to the input electrodes of the parallel shift registers, is shown in FIG. 18c. FIG. 18d shows the $\phi_{T2}$ signal which causes charges stored beneath the output electrode of each parallel shift register to be transferred into the output serial shift register to be supplied to sense amplifier 300. The $\phi_{T1}$ and $\phi_{T2}$ clock signals occur every 31½ and 32½ cycles, which corresponds to the number of cycles required to completely load or unload the serial input or output shift registers.

An expanded view of clock signals $\phi_1$, $\phi_2$, $\phi_{T1}$ and $\phi_{T2}$ is shown in FIGS. 18e through 18h. These figures depict the relative durations of the signals in the time period between cycle 61 and cycle 1 of the $\phi_1$ clock signal.

FIGS. 18i through 18l also depict in expanded form the relationship of the four previously mentioned clock signals, however, this time in the time period between cycle 29 and cycle 33 of the $\phi_1$ clock signal.

A further detailed view of the relationship of the four system clocks is shown in FIG. 19. FIG. 19 includes cross referencing to the parameters set forth in FIG. 17 to thereby specify minimum periods which must occur between the various signals shown in FIG. 19. For example, using the detailed system depicted in FIGS. 3 through 16, the $\phi_{T2}$ pulse width (TTHTL) must be a minimum of 30 nanoseconds.

Modes of Operation of System—FIGS. 20 to 23

The relationship of the clock signals $\phi_1$ and $\phi_2$ with the address, chip enable, write enable and data output signals occurring during the read-only mode of operation of the memory depicted in FIGS. 3 through 16 is shown in FIG. 20. In the read-only mode, both signals CE and $\overline{WE}$ are high. In the manner previously explained, this causes data from the selected block to be presented to the output buffer after the rising edge of the $\phi_2$ clock. The data appear at the data output terminal after an access time has elapsed following the rising edge of signal $\phi_2$. The $\phi_2$ pulse width does not have to be equal to or greater than the access time. That is, the data presented could be valid at the data output terminal after or before the falling edge of $\phi_2$ depending upon the $\phi_2$ high time. The output data remains valid up to the end of the $\phi_1$ clock of the next cycle. As has been previously described, the data from all 16 blocks recirculates automatically, while the data from the selected block are supplied to the output pin.

The relationship of signals $\phi_1$, $\phi_2$, address inputs, chip enable, data output, data input and write enable signals during the read-write mode is shown in FIG. 21. During the read-write mode, signal $\overline{WE}$ is low while signal CS is high. In the read-write mode, data from the selected block is available at the data output terminal just as previously described in the read mode. In addition, the recirculation path of the addressed block of array 100 is disabled. The addressed block of CCD memory array 100 receives data from the data input terminal during the $\phi_2$ high time. The information is written into the memory by the falling edge of the $\phi_2$ clock. This requires a non-zero setup time for $\overline{WE}$ and DI with respect to the falling edge of signal $\phi_2$. In the continuous write mode, the validity of $\overline{WE}$ and DI before the trailing edge of $\phi_1$ automatically provides the required setup time. While this occurs, the nonselected 15 blocks of memory array 100 automatically recirculate.

FIG. 22 shows the relationship of signals $\phi_1$, $\phi_2$, address inputs, chip enable, data output, write enable and data input during the read-modify-write mode of operation. In this mode of operation, the chip select signal CS is high, and the $\overline{WE}$ signal is high but changes to low. According to the previous description, the blocks of the memory are always in a read mode whenever the chip enable signal CE is high. Because the access time is determined from the leading edge of $\phi_2$ and the setup times of $\overline{WE}$ and DI are determined from the trailing edge of $\phi_2$, the read-write mode requires an extended $\phi_2$ high time. In this mode, signal $\overline{WE}$ goes low whenever the modified data are presented to the input. The read-modify-write mode of operation may be particularly useful when several memory arrays, each comprised of many individual blocks, are cascaded together.

FIG. 23 depicts the recirculate mode of operation of the memory. In this mode, the chip enable signal CE is low, causing the data stored in all 16 blocks to be recirculated. The memory therefore disregards signal $\overline{WE}$, any address inputs and signal DI. The output from the memory is supplied to a high-impedance state after the trailing edge of the $\phi_1$ clock. In this mode of operation, minimum power is consumed as the pulse widths of $\phi_1$ and $\phi_2$ are kept at a minimum at the lowest-allowed frequency.

Ripple Clock Signals—FIG. 24

FIG. 24 shows the interrelationship of the system clock signals $\phi_1$, $\phi_2$, $\phi_{T1}$ and $\phi_{T2}$ with ripple clock signals R1 through R8 and the various intermediate signals used to generate R1 through R8. The signals shown in FIG. 24 are given the same designation as the signals shown in FIGS. 16a–16d. For example, in FIG. 24bb, signal S3 is shown, which corresponds to signal S3 supplied by circuit 442 in FIG. 16c. Similarly, signal R1, generated by circuit 730, corresponds to signal R1 shown as FIG. 24hh.

Fabrication—FIG. 25

One embodiment of this invention as an integrated circuit will be commercially available as Fairchild product CCD 464. A photomicrograph of this product appears in *Scientific American*, September, 1977, at page 140. The embodiment of this invention shown in the detailed drawings may be fabricated using well known semiconductor technology. One such process is known in the industry as n-channel Isoplanar double polysilicon gate MOS technology. A cross-section of the CCD region of the structure formed by this process is shown in FIG. 25. The CCD structure is a buried channel gapless structure with self-aligned implanted barriers. In one embodiment the memory cell size is 12μ by 14μ with 30 fC of stored charge for a "1." The substrate is 30–40 Ωcm p-type semiconductor material.

The CCD area is implanted to form an n-type layer at the surface. After the first polysilicon layer is grown and defined, a p-type implant is used in the CCD area to lower the channel potential. This creates barriers in the gaps between the first polysilicon gates. These gaps are then covered with a second polysilicon layer and are connected to adjacent first poly gates to form storage and transfer regions. The charge is stored in the potential well formed under the first polysilicon and stays away from the surface. Because interaction with surface states is eliminated, high transfer efficiency can be maintained while the operating frequency is changed. The process gives a transfer efficiency better than 0.9995 without the use of fat zero.

What is claimed is:

1. A charge coupled device memory device having a data input terminal and a data output terminal comprising:
   a plurality of blocks of memory, each block including
   (1) an array of charge coupled memory cells for storing data in a serial-parallel-serial arrangement of shift registers, said array having an input terminal and an output terminal,
   (2) charge writing means connected to the input terminal for injecting a signal charge into the array,
   (3) sense amplifier means connected to the output terminal for detecting the signal charge at the output terminal and producing an output signal in response thereto,
   (4) input logic means connected to each of the charge writing means, the sense amplifier means, and the data input terminal and connected to receive first address signals to determine when the charge writing means is to be activated to inject charge into the array in response to signals from one of the data input terminal and the sense amplifier means,
   (5) output decoding means connected to the sense amplifier means and connected to receive second address signals to determine when the output signal from the sense amplifier means is to be supplied to the data output terminal,
   means for generating the first and second address signals to thereby select any of the plurality of blocks of memory and connect said block to at least one of the data input terminal and data output terminal, and
   clock means for controlling the operation of each of the blocks of memory,
   wherein the charge writing means comprises a substrate of chosen conductivity, a first region of chosen conductivity formed in the substrate to which a fixed potential is applied, a second region in the substrate formed from the same conductivity material as the substrate and nowhere in contact with the first region, a first electrode disposed on an insulating layer formed on the substrate and said electrode extending from the first region to the second region, and a second electrode disposed on the insulating layer above the second region and the substrate adjacent the second region on the side of the second region opposite the first electrode.

2. Structure as in claim 1 wherein the substrate comprises a layer of chosen conductivity formed on a base of opposite conductivity.

3. Structure as in claim 1 wherein the input logic means comprises:
   a first and a second transistor connected in series,
   a third and a fourth transistor connected in series, the combination of said third and fourth transistors being connected in parallel to the combination of the first and second transistors, the fourth transistor and the second transistor connected at node A, the first and third transistors being connected at node B,
   a fifth transistor connected in series to node B wherein the clock means supplies signals to node A and to the fifth transistor,
   the first address signals are supplied to the first transistor,
   signals from the sense amplifier means are supplied to the fourth transistor,
   the data input terminal is connected to the second transistor,
   a source of electrical potential is switchably connected to the third transistor, and
   the fifth transistor is connected to the charge writing means.

4. Structure as in claim 1 wherein the output decoding means comprises:
   first and second transistors connected together in series,
   third and fourth transistors connected in series,
   the first and third transistors being connected together to receive the second address signals,
   the second and fourth transistors being connected together to ground,
   the first and fourth transistors being connected to receive first signals from the sense amplifier means,
   the second and third transistors being connected to receive signals from the sense amplifier complementary to said first signals,
   fifth and sixth transistors connected to the connection between the second and fourth transistors, said fifth transistor also connected to the connection between the first and second transistors, said sixth transistor also connected to the connection between the third and fourth transistors.

5. Structure as in claim 4 wherein the second address signals are supplied through a capacitor and a seventh transistor, said seventh transistor also being connected to the clock means.

6. A charge coupled device memory device having a data input terminal and a data output terminal comprising:
   a plurality of blocks of memory, each block including
   (1) an array of charge coupled memory cells for storing data in a serial-parallel-serial arrangement of shift registers, said array having an input terminal and an output terminal,
   (2) charge writing means connected to the input terminal for injecting a signal charge into the array,
   (3) sense amplifier means connected to the output terminal for detecting the signal charge at the output terminal and producing an output signal in response thereto,
   (4) input logic means connected to each of the charge writing means, the sense amplifier means, and the data input terminal and connected to receive first address signals to determine when the charge writing means is to be activated to inject charge into the array in response to signals from one of the data input terminal and the sense amplifier means,
   (5) output decoding means connected to the sense amplifier means and connected to receive second address signals to determine when the output signal from the sense amplifier means is to be supplied to the data output terminal,
   means for generating the first and second address signals to thereby select any of the plurality of blocks of memory and connect said block to at least one of the data input terminal and data output terminal, and clock means for controlling the operation of each of the blocks of memory, wherein the sense amplifier means includes an output gate which comprises a substrate of chosen conductivity, a barrier region of chosen conductivity formed in said substrate, a sense node region of chosen conductivity formed in said substrate and spaced apart from said barrier region, an electrode disposed over, but not in ohmic contact with, said barrier region and disposed over, but not in ohmic contact with, the region between the barrier region and the sense node, and a source of clock signals from said clock means being connected to the electrode.

7. Structure as in claim 6 wherein the substrate comprises a layer of chosen conductivity formed on a base of opposite conductivity.

8. Structure as in claim 6 wherein the sense amplifier means includes half-bit storage means comprising:

a first and a second transistor connected in series together between a potential source and ground, said transistors being connected together at node A, a third and a fourth transistor connected together in series between the potential source and the clock means, a fifth transistor connected to node A, to the third transistor, and to the fourth transistor, a first capacitor connected between the third transistor and node A, a second capacitor connected between ground and node A, a third capacitor connected between the fourth transistor and ground, and a sixth transistor connected to the clock means, ground and the fourth transistor.

9. Structure as in claim 6 wherein the sense amplifier means includes means to compensate for the amount of signal charge lost in transferring the signal charge from the serial register to the parallel registers.

10. Structure as in claim 9 wherein the sense amplifier means includes means to generate a reference charge and means to compare the reference charge with the signal charge detected at the output terminal of the array of charge coupled memory cells.

11. Structure as in claim 10 wherein the means to compensate includes means to subtract an amount of charge from the reference charge substantially equal to the amount of charge lost in transferring the signal charge from the serial register to the parallel register.

12. Structure as in claim 11 wherein the means to subtract includes causing the reference charge to travel through a semiconductor structure substantially identical to the semiconductor structure through which the signal charge passes.

13. Structure as in claim 12 wherein the reference charge is forced to travel through a right angle turn in the semiconductor substrate.

* * * * *